(12) United States Patent
Imai et al.

(10) Patent No.: US 12,507,482 B2
(45) Date of Patent: Dec. 23, 2025

(54) ACTIVE MATRIX SUBSTRATE AND MANUFACTURING METHOD THEREOF

(71) Applicant: Sharp Display Technology Corporation, Kameyama (JP)

(72) Inventors: Hajime Imai, Kameyama (JP); Tohru Daitoh, Kameyama (JP); Yoshihito Hara, Kameyama (JP); Tetsuo Kikuchi, Kameyama (JP); Teruyuki Ueda, Kameyama (JP); Masaki Maeda, Kameyama (JP); Tatsuya Kawasaki, Kameyama (JP); Yoshiharu Hirata, Kameyama (JP)

(73) Assignee: SHARP DISPLAY TECHNOLOGY CORPORATION, Kameyama (JP)

( * ) Notice: Subject to any disclaimer, the term of this patent is extended or adjusted under 35 U.S.C. 154(b) by 391 days.

(21) Appl. No.: 18/130,444

(22) Filed: Apr. 4, 2023

(65) Prior Publication Data

US 2023/0317739 A1  Oct. 5, 2023

(30) Foreign Application Priority Data

Apr. 5, 2022  (JP) .................................. 2022-063027

(51) Int. Cl.
*H01L 27/12* (2006.01)
*H10D 86/01* (2025.01)
(Continued)

(52) U.S. Cl.
CPC ......... *H10D 86/60* (2025.01); *H10D 86/0231* (2025.01); *H10D 86/451* (2025.01)

(58) Field of Classification Search
CPC .... H10D 86/60; H10D 86/0231; H10D 86/01; H10D 86/451; H10D 86/40; H10D 86/423; H10D 86/411
See application file for complete search history.

(56) References Cited

U.S. PATENT DOCUMENTS

| 2012/0138922 A1 | 6/2012 | Yamazaki et al. |
| 2013/0285044 A1 | 10/2013 | Yuan et al. |

(Continued)

FOREIGN PATENT DOCUMENTS

| JP | 2012-134475 A | 7/2012 |
| JP | 2013-232619 A | 11/2013 |

(Continued)

*Primary Examiner* — Nikolay K Yushin
(74) *Attorney, Agent, or Firm* — Keating & Bennett, LLP

(57) ABSTRACT

The active matrix substrate includes a plurality of oxide semiconductor TFTs supported by a substrate. Each of the plurality of oxide semiconductor TFTs includes an oxide semiconductor layer including a channel region, a lower electrode positioned between the oxide semiconductor layer and the substrate, and an insulating layer positioned between the oxide semiconductor layer and the lower electrode. The insulating layer has a layered structure including a lower layer, an upper layer positioned between the lower layer and the oxide semiconductor layer, and an intermediate layer positioned between the lower layer and the upper layer. The upper layer is a silicon oxide layer, the intermediate layer contains at least silicon and nitrogen, and the lower layer contains at least silicon, nitrogen, and oxygen. A hydrogen desorption amount in the lower layer is larger than a hydrogen desorption amount in the intermediate layer.

14 Claims, 18 Drawing Sheets

(51) Int. Cl.
*H10D 86/40* (2025.01)
*H10D 86/60* (2025.01)

(56) References Cited

U.S. PATENT DOCUMENTS

| | | |
|---|---|---|
| 2013/0320334 A1 | 12/2013 | Yamazaki et al. |
| 2014/0151685 A1 | 6/2014 | Tokunaga et al. |
| 2014/0286076 A1 | 9/2014 | Aoki et al. |
| 2019/0280126 A1 | 9/2019 | Kikuchi et al. |
| 2020/0027958 A1 | 1/2020 | Suzuki et al. |
| 2024/0395940 A1* | 11/2024 | Yamazaki .......... H10D 30/6755 |

FOREIGN PATENT DOCUMENTS

| | | |
|---|---|---|
| JP | 2014-007399 A | 1/2014 |
| JP | 2014-131022 A | 7/2014 |
| JP | 2014-209727 A | 11/2014 |
| JP | 2016-111203 A | 6/2016 |
| JP | 2019-160829 A | 9/2019 |
| WO | 2018/180968 A1 | 10/2018 |

* cited by examiner

ACTIVE MATRIX SUBSTRATE AND MANUFACTURING METHOD THEREOF

CROSS-REFERENCE TO RELATED APPLICATIONS

This application claims the benefit of priority to Japanese Patent Application Number 2022-063027 filed on Apr. 5, 2022. The entire contents of the above-identified application are hereby incorporated by reference.

BACKGROUND

Technical Field

The disclosure relates to an active matrix substrate and a manufacturing method thereof.

An active matrix substrate used in a liquid crystal display device, an organic electroluminescence (EL) display device, or the like includes a display region including a plurality of pixels, and a region other than the display region (a non-display region or a frame region). The display region includes a switching element such as a Thin Film Transistor (hereinafter referred to as a "TFT") for each of the pixels. As such a switching element, in the related art, a TFT including an amorphous silicon film serving as an active layer (hereinafter referred to as an "amorphous silicon TFT") and a TFT including a polycrystalline silicon film serving as an active layer (hereinafter referred to as a "polycrystalline silicon TFT") have been widely used.

In the non-display region of the active matrix substrate, a peripheral circuit such as a drive circuit may be monolithically (integrally) formed. For example, in the non-display region, the gate driver circuit may be formed monolithically, and the source driver circuit may be mounted by a chip on glass (COG) process. The peripheral circuit such as a drive circuit includes TFTs.

In the present specification, a TFT arranged in each pixel in the display region is referred to as a "pixel TFT", and a TFT configuring the peripheral circuit is referred to as a "circuit TFT". Note that, in the active matrix substrate used in the organic EL display device, a pixel circuit including a plurality of the TFTs is provided in one pixel. In this case, the plurality of TFTs (for example, a drive TFT, a selection TFT, and the like) constituting one pixel circuit are referred to as "pixel TFTs".

There is proposed use of an oxide semiconductor as a material of the active layer of the pixel TFT, in place of amorphous silicon and polycrystalline silicon. Such a TFT is referred to as an "oxide semiconductor TFT". The oxide semiconductor has a higher mobility than amorphous silicon. Thus, the oxide semiconductor TFT can operate at a higher speed than the amorphous silicon TFT. Thus, the oxide semiconductor TFT can be suitably used not only as a pixel TFT but also as a circuit TFT.

For example, JP 2019-160829 A discloses a structure of the oxide semiconductor TFT having a top gate structure and a bottom gate structure.

SUMMARY

In the active matrix substrate, a relatively thick insulating film (hereinafter referred to as "lower insulating film") such as a silicon nitride film may be formed on the substrate side of the active layer. The lower insulating film may contain a large amount of hydrogen depending on a material (composition), a film formation method, film formation conditions, and the like. As a result of investigation by the present inventors, when the lower insulating film containing a large amount of hydrogen is used in the active matrix substrate using the oxide semiconductor TFT, the TFT characteristics may vary due to hydrogen entering a channel portion of the oxide semiconductor layer. Specifically, when the oxide semiconductor layer is subjected to a reduction action due to the entry of hydrogen, a threshold voltage Vth may shift to the negative side, and an off-leak current may increase or depletion phenomenon (normally on state) may occur.

An embodiment of the disclosure has been conceived in light of the above-described circumstances, and an object of the disclosure is to provide an active matrix substrate including an oxide semiconductor TFT in which variation in TFT characteristics due to hydrogen is suppressed.

An active matrix substrate and a manufacturing method of the active matrix substrate are disclosed in the present specification, in the following items.

Item 1

An active matrix substrate including a substrate, and a plurality of oxide semiconductor TFTs supported by the substrate, wherein
  each of the plurality of oxide semiconductor TFTs includes
  an oxide semiconductor layer including a channel region,
  a lower electrode positioned between the oxide semiconductor layer and the substrate, and
  an insulating layer positioned between the oxide semiconductor layer and the lower electrode,
  the insulating layer has a layered structure including a lower layer, an upper layer positioned between the lower layer and the oxide semiconductor layer, and an intermediate layer positioned between the lower layer and the upper layer,
  the upper layer is a silicon oxide layer,
  the intermediate layer contains at least silicon and nitrogen,
  the lower layer contains at least silicon, nitrogen, and oxygen, and
  a hydrogen desorption amount of the lower layer is larger than a hydrogen desorption amount of the intermediate layer, and each of the hydrogen desorption amount of the lower layer and the hydrogen desorption amount of the intermediate layer is a desorption amount of hydrogen molecules per unit thickness in a range from 25° C. to 600° C. by TDS analysis.

Item 2

The active matrix substrate according to item 1, wherein the lower layer is thicker than the intermediate layer.

Item 3

The active matrix substrate according to item 1, wherein the intermediate layer is thicker than the lower layer.

Item 4

The active matrix substrate according to any one of items 1 to 3, wherein the intermediate layer is a silicon nitride layer.

Item 5

The active matrix substrate according to any one of items 1 to 4, wherein an oxygen concentration in the lower layer is lower than an oxygen concentration in the upper layer and higher than an oxygen concentration in the intermediate layer.

Item 6

The active matrix substrate according to item 5, wherein the lower layer is a silicon nitride oxide layer containing nitrogen at a higher ratio than oxygen.

Item 7

The active matrix substrate according to item 5, wherein the lower layer is a silicon oxynitride layer containing nitrogen at a lower ratio than oxygen.

Item 8

The active matrix substrate according to any one of items 1 to 7, wherein the lower layer has a refractive index higher than a refractive index of the substrate and lower than a refractive index of the intermediate layer.

Item 9

The active matrix substrate according to any one of items 1 to 8, wherein a thickness of the lower layer is three times or more of a thickness of the intermediate layer.

Item 10

The active matrix substrate according to any one of items 1 to 9, wherein each of the plurality of oxide semiconductor TFTs is a bottom gate type TFT with the lower electrode as a gate electrode.

Item 11

The active matrix substrate according to any one of items 1 to 9, wherein each of the plurality of oxide semiconductor TFTs further includes a gate electrode positioned on an opposite side to the substrate of the oxide semiconductor layer, and a gate insulating layer positioned between the oxide semiconductor layer and the gate electrode.

Item 12

The active matrix substrate according to any one of items 1 to 11, wherein the oxide semiconductor layer of each of the plurality of oxide semiconductor TFTs includes an In—Ga—Zn—O-based semiconductor.

Item 13

The active matrix substrate according to item 12, wherein the oxide semiconductor layer includes a crystalline portion.

Item 14

A manufacturing method of the active matrix substrate according to any one of items 1 to 13, the manufacturing method including:

forming the insulating layer, wherein the forming the insulating layer includes forming, using a CVD, the lower layer on the lower electrode at a first deposition rate, and forming, using a CVD, the intermediate layer on the lower layer at a second deposition rate lower than the first deposition rate.

An embodiment of the disclosure provides an active matrix substrate including an oxide semiconductor TFT in which variation in TFT characteristics due to hydrogen is suppressed.

BRIEF DESCRIPTION OF DRAWINGS

The disclosure will be described with reference to the accompanying drawings, wherein like numbers reference like elements.

DESCRIPTION OF EMBODIMENTS

First Embodiment

Hereinafter, an active matrix substrate according to a first embodiment will be described with reference to the accompanying drawings. The active matrix substrate according to the present embodiment is, for example, used in a liquid crystal display device of a fringe field switching (FFS) mode. Note that the active matrix substrate according to the present embodiment is only required to include a plurality of oxide semiconductor TFTs on a substrate, and broadly used in various display devices such as an organic EL display device and in electronic devices, for example.

Basic Configuration of Active Matrix Substrate 1001

Figure 1:
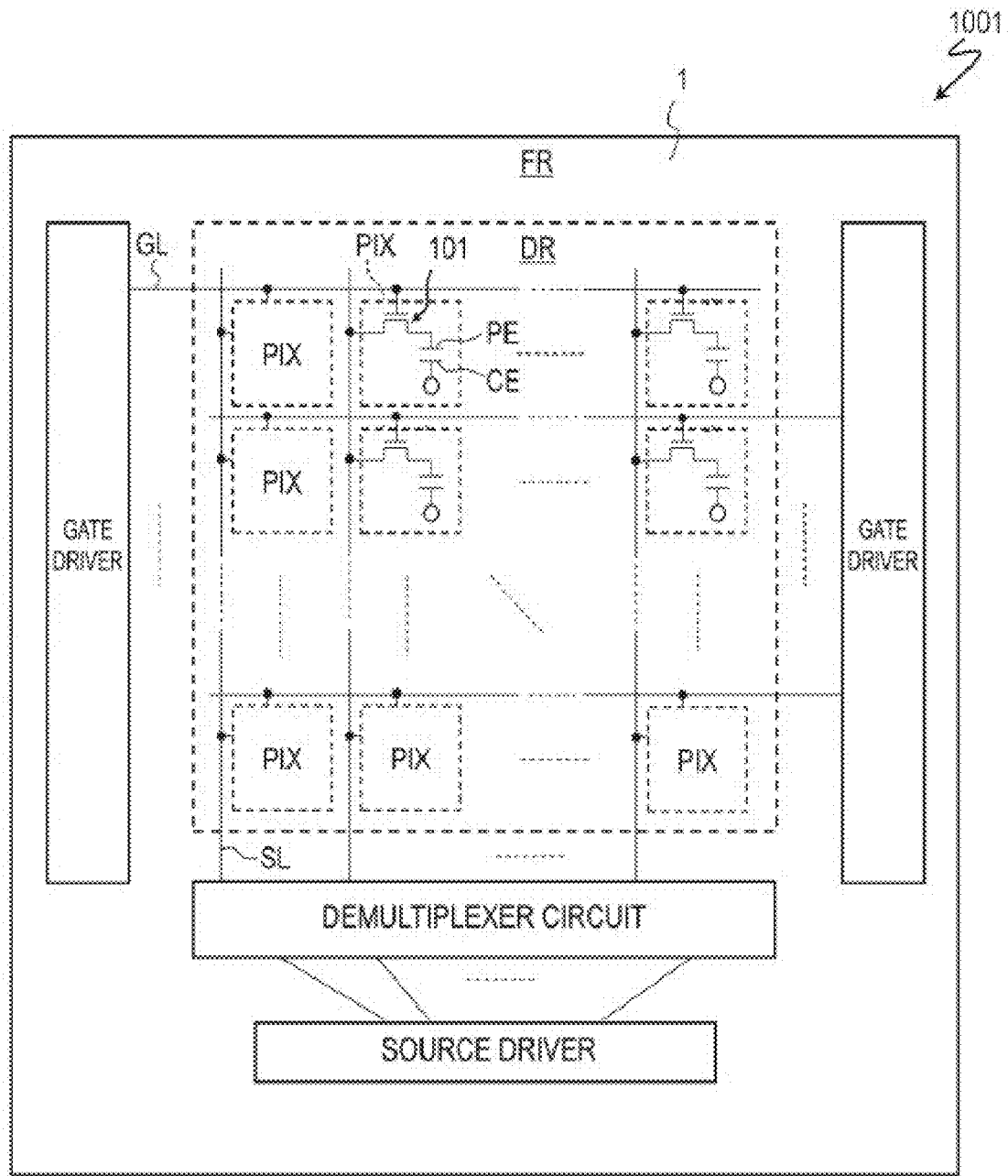
FIG. 1 is a schematic diagram illustrating an example of a planar structure of an active matrix substrate 1001 according to a first embodiment.

FIG. 1 is a schematic diagram illustrating an example of a planar structure of an active matrix substrate 1001 according to the present embodiment.

The active matrix substrate 1001 includes a display region DR, and a region (a non-display region or a frame region) FR other than the display region DR. The display region DR is constituted of pixel regions PIX arranged in a matrix shape. The pixel regions PIX (also simply referred to as "pixels") are regions corresponding to pixels of the display device. The non-display region FR is a region positioned in a periphery of the display region DR and does not contribute to display.

In the display region DR, a plurality of gate bus lines GL extending in a row direction, and a plurality of source bus lines SL extending in a column direction are formed. The pixel regions PIX are defined by the gate bus lines GL and the source bus lines SL, for example. The gate bus lines GL are connected to respective terminals of the gate driver. The source bus lines SL are connected to respective terminals of the source driver.

Each pixel region PIX includes an oxide semiconductor TFT (hereinafter, abbreviated as "TFT") 101 that is a pixel TFT and a pixel electrode PE. In the present embodiment, the TFT 101 has a bottom gate structure.

A gate electrode of the TFT 101 is electrically connected to the corresponding gate bus line GL, and a source electrode is electrically connected to the corresponding source bus line SL. A drain electrode is electrically connected to the pixel electrode PE. In a case where the active matrix substrate 1001 is applied to a display device of a transverse electrical field mode such as an FFS mode, an electrode (common electrode) CE that is common to the plurality of pixels is provided in the active matrix substrate 1001.

In the non-display region FR, for example, a drive circuit such as a gate driver is monolithically provided on the substrate 1. A source driver is mounted on the active matrix substrate 1001, for example. In the present example, a demultiplexer circuit is monolithically formed in addition to the gate driver. The demultiplexer circuit functions as a source switching circuit that distributes video data from one video signal line connected to each terminal of the source driver to a plurality of source wiring lines.

A plurality of circuit TFTs constituting the peripheral circuits are formed in the non-display region of the active matrix substrate 1001. The circuit TFTs includes a drive circuit TFT constituting the gate driver, a source switching circuit TFT constituting the demultiplexer circuit, and the like. At least a part of the circuit TFTs may be the oxide semiconductor TFT having the bottom gate structure. Each of the circuit TFTs may be formed by a common process using the same semiconductor film as the TFT 101 that is the pixel TFT.

Configuration of Pixel Region PIX and Oxide Semiconductor TFT

Each pixel region PIX in the active matrix substrate 1001 will be described with reference to the drawings. A structure of the oxide semiconductor TFT will be described using the pixel TFT as an example. The active matrix substrate 1001 typically includes the plurality of pixel regions and the plurality of pixel TFTs, but only a single pixel region and a single pixel TFT disposed in the pixel region will be illustrated and described below.

Figure 2A:
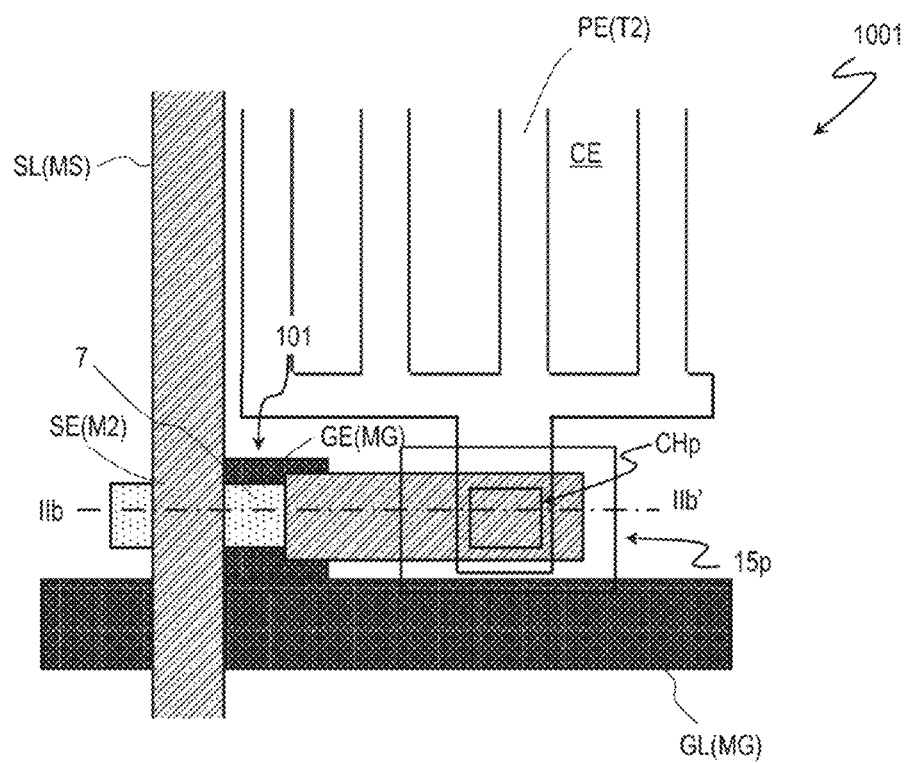
FIG. 2A is a plan view illustrating an example of one pixel region PIX in the active matrix substrate 1001 according to the first embodiment.
Figure 2B:
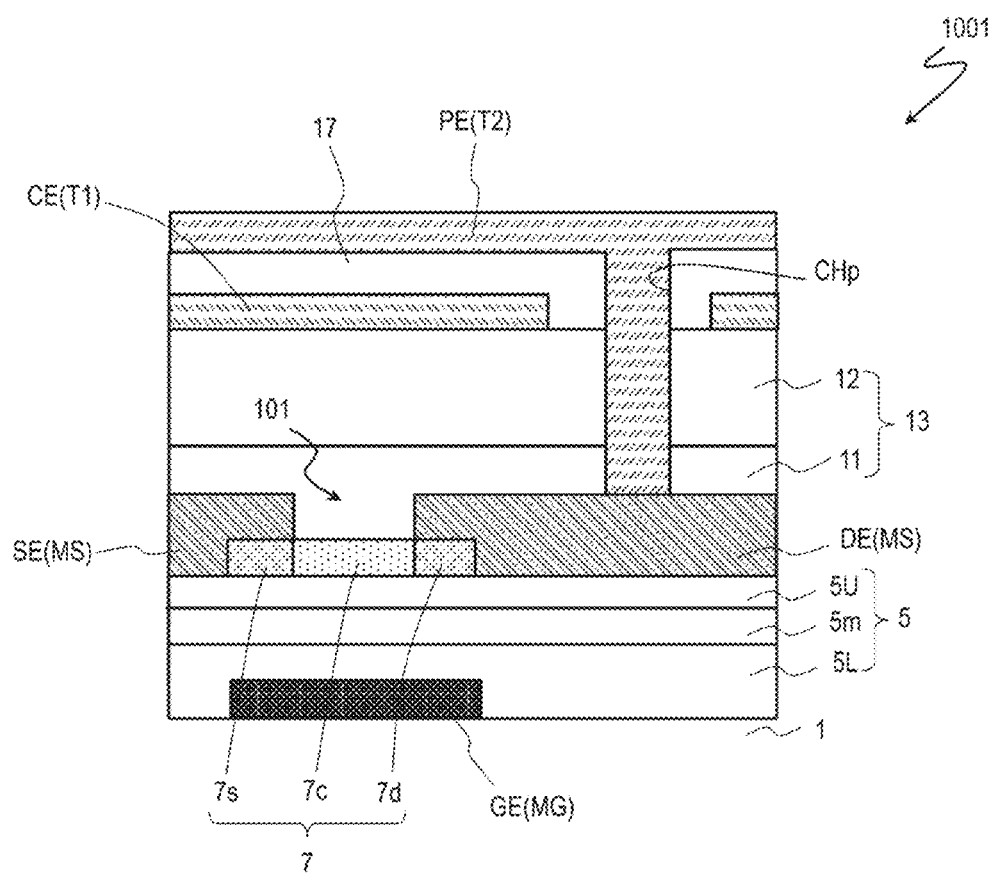
FIG. 2B is a cross-sectional view taken along a line IIb-IIb' in FIG. 2A.

FIG. 2A is a plan view illustrating an example of a part of one pixel region PIX in the active matrix substrate 1001. FIG. 2B is a cross-sectional view taken along a line IIb-IIb' in FIG. 2A.

First, a layer structure of the active matrix substrate 1001 will be described with reference to FIG. 2B. The active matrix substrate 1001 includes a gate metal layer MG, a lower insulating layer 5, an oxide semiconductor layer 7, a source metal layer MS, an upper insulating layer 13, a first transparent conductive layer T1, a dielectric layer 17, and a second transparent conductive layer T2 in this order from the substrate 1 side.

The gate metal layer MG is a layer including electrodes, wiring lines, and the like formed of a first conductive film, and includes, for example, a plurality of the gate bus lines GL, gate electrodes GE of the respective TFTs, and the like. The source metal layer MS is a layer including electrodes, wiring lines, and the like formed of a second conductive film, and includes, for example, a plurality of the source bus lines SL, source electrodes SE and drain electrodes DE of the respective TFTs, and the like. The first transparent conductive layer T1 is a layer including electrodes and wiring lines formed using a first transparent conductive film, and the second transparent conductive layer T2 is a layer including electrodes and wiring lines formed using a second transparent conductive film. One of the first transparent conductive layer T1 and the second transparent conductive layer T2 may include the common electrode CE, and the other may include the pixel electrode PE.

In the drawings, a reference sign for each constituent element may be followed by a sign indicating the metal layer or the insulating film in parenthesis. For example, for the electrode or the wiring line formed in the gate metal layer MG, "(MG)" may be denoted after its reference sign.

The active matrix substrate 1001 includes the substrate 1, the plurality of source bus lines SL and the plurality of gate bus lines GL supported by the substrate 1. In the example illustrated, the gate metal layer MG including the plurality of gate bus lines GL is disposed closer to the substrate 1 than the source metal layer MS including the plurality of source bus lines SL. The TFT 101 having the bottom gate structure is provided as the pixel TFT in each pixel region PIX. It is only necessary that the TFT 101 correspond to the corresponding pixel region PIX, and a part of the TFT 101 may be positioned in a pixel region other than the corresponding pixel region.

The TFT 101 is supported by the substrate 1. The TFT 101 includes the oxide semiconductor layer 7, the gate electrode (also referred to as a "lower electrode") GE positioned between the oxide semiconductor layer 7 and the substrate 1, the lower insulating layer 5 positioned between the oxide semiconductor layer 7 and the gate electrode GE, the source electrode SE, and the drain electrode DE.

The gate electrode GE is formed in the gate metal layer MG. When viewed from the normal direction of the substrate 1, the gate electrode GE overlaps with at least a part of the oxide semiconductor layer 7. The gate electrode GE may be connected to the corresponding gate bus line GL, or may be a part of the gate bus line GL. In such a case, a portion of the gate bus line GL, which overlaps with the oxide semiconductor layer 7 when viewed from the normal direction of the substrate 1, is referred to as the "gate electrode GE".

In the present embodiment, the lower insulating layer 5 functions as the gate insulating layer of the TFT 101. The lower insulating layer 5 may cover the gate electrode GE. The lower insulating layer 5 may cover the gate metal layer MG over the entire display region.

The lower insulating layer 5 has a layered structure including a lower layer 5L, an intermediate layer 5m, and an upper layer 5U in this order from the substrate 1 side. The upper layer 5U is positioned between the lower layer 5L and the oxide semiconductor layer 7. The intermediate layer 5m is positioned between the lower layer 5L and the upper layer 5U. The intermediate layer 5m may be in contact with the upper face of the lower layer 5L. The upper layer 5U may be in contact with the upper face of the intermediate layer 5m.

The upper layer 5U is a silicon oxide layer. Each of the intermediate layer 5m and the lower layer 5L contains at least silicon and nitrogen. A hydrogen desorption amount in the lower layer 5L is larger than a hydrogen desorption amount in the intermediate layer. In the present specification, each of the hydrogen desorption amount of the lower layer 5L and the hydrogen desorption amount of the intermediate layer 5m refers to a desorption amount of hydrogen molecules per unit thickness in a range from 25° C. to 600° C. by thermal desorption spectroscopy (TDS). The unit thickness (film thickness used for TDS analysis) is, for example, 300 nm. For example, the intermediate layer 5m may be a silicon nitride layer, and the lower layer 5L may be silicon nitride oxide (SiNxOy; x>y). The detailed structure of the lower insulating layer 5 will be described later.

The oxide semiconductor layer 7 includes a channel region 7c, and a source contact region 7s and a drain contact region 7d positioned on both sides of the channel region 7c, when viewed from the normal direction of the substrate 1. The source contact region 7s is a region electrically connected to the source electrode SE, and the drain contact region 7d is a region electrically connected to the drain electrode DE. The channel region 7c is a region positioned between the source contact region 7s and the drain contact region 7d and overlapping with the gate electrode GE, when viewed from the normal direction of the substrate 1. The source contact region 7s and the drain contact region 7d may be low-resistive regions having specific resistance lower than that of the channel region 7c.

The source electrode SE and the drain electrode DE are formed by a conductive film (second conductive film) identical to that of the source bus line SL (that is, in the source metal layer MS), for example. In the present example, the source electrode SE and the drain electrode DE are in direct contact with upper faces of the source contact region 7s and the drain contact region 7d, respectively. For example, the source contact region 7s and the drain contact region 7d may be reduced by being in direct contact with the source electrode SE and the drain electrode DE, respectively, and may have specific resistance lower than that of the channel region 7c.

The source electrode SE is electrically connected to the corresponding source bus line SL. The source electrode SE may be a part of the source bus line SL. In such a case, a portion of the source bus line SL, which is connected to the oxide semiconductor layer 7, is referred to as the "source electrode SE".

The TFT 101 is covered with the upper insulating layer 13. The upper insulating layer 13 includes an inorganic insulating layer (passivation film) 11, for example. As illustrated, the upper insulating layer 13 may have a layered structure including the inorganic insulating layer 11 and an organic insulating layer 12 formed on the inorganic insulating layer 11. The organic insulating layer 12 need not necessarily be formed. Alternatively, the organic insulating layer 12 may be formed only in the display region.

The active matrix substrate 1001 further includes a plurality of the pixel electrodes PE, the common electrode CE, and the dielectric layer 17 positioned between the pixel electrodes PE and the common electrode CE. Each pixel electrode PE is disposed in a corresponding pixel region PIX.

The pixel electrode PE and the common electrode CE are disposed above the upper insulating layer 13, the pixel electrode PE and the common electrode CE partially overlapping with each other across the dielectric layer 17. In the present example, the pixel electrode PE is disposed on the common electrode CE across the dielectric layer 17. The common electrode CE is formed in the first transparent conductive layer T1, and the pixel electrode PE is formed in the second transparent conductive layer T2. Although not illustrated, the common electrode CE may be disposed on the pixel electrode PE across the dielectric layer 17. In each pixel region PIX, of the pixel electrode PE and the common electrode CE, one electrode (here, the pixel electrode PE) formed in the second transparent conductive layer T2 is provided with one or a plurality of slits (openings) or notched portions.

The pixel electrode PE is disposed for each pixel region PIX. The pixel electrode PE is electrically connected to the oxide semiconductor layer 7 of the TFT 101 in a pixel contact portion. In the present example, in the pixel contact portion, a pixel contact hole CHp for exposing the drain electrode DE is formed in the dielectric layer 17 and the upper insulating layer 13. The pixel electrode PE is electrically connected to the drain electrode DE in the pixel contact hole CHp. The pixel electrode PE may be in direct contact with the drain electrode DE. Note that the TFT 101 need not include the drain electrode in the source metal layer MS. In this case, the pixel electrode PE may be in direct contact with the drain contact region 7d of the oxide semiconductor layer 7 in the pixel contact hole CHp. In other words, a part of the pixel electrode PE may function as the drain electrode of the TFT 101.

The common electrode CE need not necessarily be separated for each pixel region PIX. For example, the common electrode CE may include an opening 15p in a region where the pixel contact portion is formed, and may be formed over the entire pixel region PIX except the pixel contact portion.

Note that, although the pixel TFT is described above as an example, the circuit TFT may also have the similar structure to the TFT 101. Note that, in the circuit TFT, the source contact region 7s and the drain contact region 7d of the oxide semiconductor layer 7 are connected to, for example, a wiring line in the source metal layer MS or the gate metal layer MG.

Advantageous Effects

The active matrix substrate 1001 according to the present embodiment includes the lower insulating layer 5 having the layered structure including the lower layer 5L, the intermediate layer 5m, and the upper layer 5U described above, and thus the following advantageous effects are achieved.

The lower insulating layer 5 includes the silicon oxide layer as the upper layer 5U. The silicon oxide layer is an oxygen-donating film that can supply oxygen to the oxide semiconductor layer 7. The silicon oxide layer is disposed close to the oxide semiconductor layer 7, preferably in contact with the oxide semiconductor layer 7. Thus, oxidation deficiency generated in the channel region 7c of the oxide semiconductor layer 7 can be reduced, and thus resistance lowering of the channel region can be suppressed. The lower insulating layer 5 also includes the layers containing at least nitrogen and silicon (for example, the silicon layers containing at least nitrogen), as the intermediate layer 5m and the lower layer 5L, closer to the substrate 1 of the silicon oxide layer, and thus breakdown voltage and ESD resistance can be highly ensured. Diffusion of impurities from the substrate 1 side to the oxide semiconductor layer 7 can also be suppressed. Further, the intermediate layer 5m having a relatively small hydrogen desorption amount is provided between the lower layer 5L and the oxide semiconductor layer 7 having a relatively large hydrogen desorption amount, so that hydrogen can be prevented from entering the oxide semiconductor layer 7 from the lower layer 5L. Advantageous effects by the intermediate layer 5m will be further described in detail below.

Figure 8:
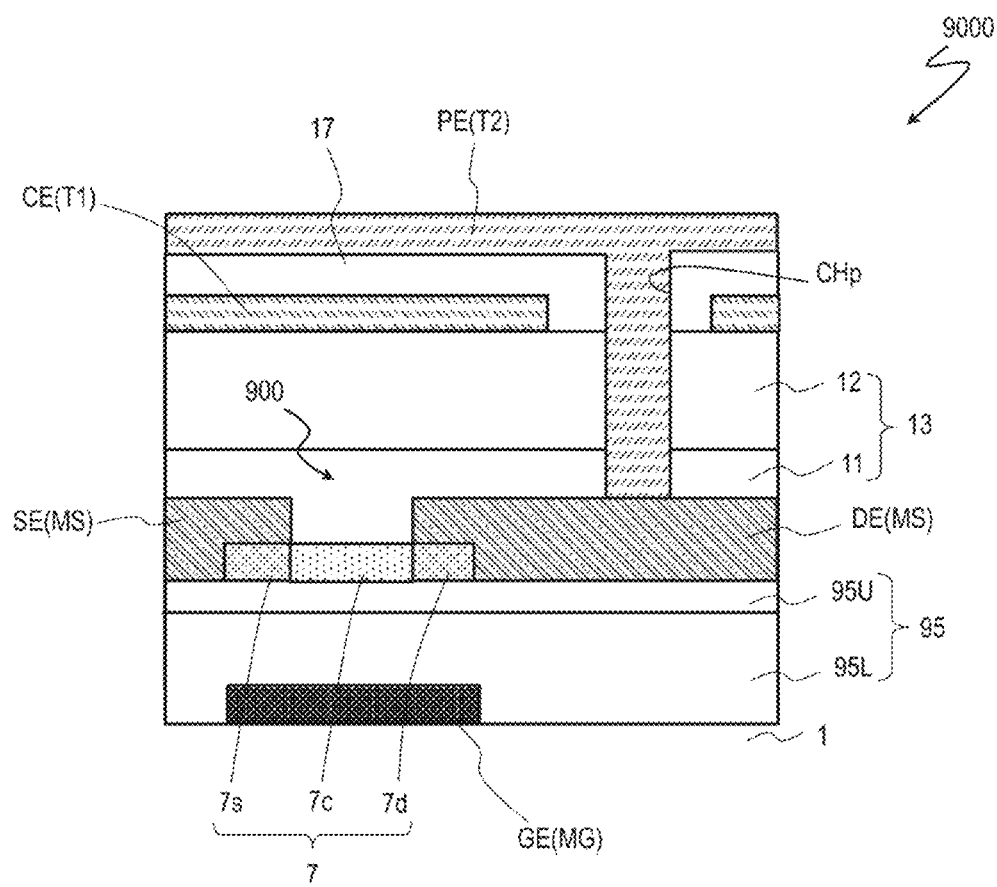
FIG. 8 is a cross-sectional view illustrating an active matrix substrate 9000 of a reference example.

FIG. 8 is a cross-sectional view illustrating an active matrix substrate 9000 of a reference example. A lower insulating layer 95 of the active matrix substrate 9000 does not include an intermediate layer. The lower insulating layer 95 has a dual-layer structure including an upper layer 95U and a lower layer 95L. The upper layer 95U is the silicon oxide layer, and the lower layer 95L is the silicon nitride layer. The active matrix substrate 9000 includes, as the pixel TFT, a bottom gate type TFT 900 in which the lower insulating layer 95 serves as a gate insulating layer. The TFT 900 has a similar structure to the TFT 101 illustrated in FIGS. 2A and 2B, except the lower insulating layer 95.

The silicon nitride layer serving as the lower layer 95L may contain a large amount of hydrogen depending on a material (composition), a film formation method, film formation conditions such as a film formation rate and a film formation temperature, and the like. For example, when the lower layer 95L is formed at a high film formation rate in order to increase throughput in manufacturing the active matrix substrate, the hydrogen amount contained in the lower layer 95L increases. In this case, hydrogen desorbed from the lower layer 95L during the manufacturing process reaches the oxide semiconductor layer 7 and reduces the oxide semiconductor, so that the resistance lowering of the oxide semiconductor layer 7 is likely to occur. As a result, the threshold voltage Vth of the TFT 900 shifts in the negative direction, and desired TFT characteristics may not be obtained. For example, depletion may occur in which the threshold voltage Vth of the TFT 900 is negative. This may be a factor of lowering of productivity (lowering of yield).

On the other hand, the lower insulating layer 5 of the present embodiment includes the intermediate layer 5m having a hydrogen desorption amount smaller than that of the lower layer 5L, closer to the oxide semiconductor layer 7 of the lower layer 5L. Thus, the intermediate layer 5m can prevent hydrogen contained in the lower layer 5L from entering the oxide semiconductor layer 7. As a result, variation in the characteristics of the TFT 101 due to the hydrogen, that is, the shift of the threshold voltage Vth of the TFT 101 in the negative direction can be suppressed. Thus, the off-leak current of the TFT 101 can be reduced, and stable TFT characteristics can be realized. The TFT 101 may have, for example, enhancement characteristics having a positive threshold voltage Vth.

The lower layer 5L may be a film having a low film density formed at a deposition rate higher than the upper layer 5U. Thus, depletion of the TFT 101 can be suppressed by the intermediate layer 5m while high throughput is maintained by the lower layer 5L.

The TFT 101 may be suitably used as the pixel TFT since the off-leak current due to the hydrogen in the lower layer 5L is reduced. The active matrix substrate 1001 may further include the circuit TFT having the structure similar to that of the TFT 101. Also in the circuit TFT, the negative shift of the threshold voltage Vth due to the hydrogen in the lower layer 5L is reduced, and thus an increase in power consumption, operation failure or malfunction of the drive circuit, and the like can be suppressed. The circuit TFT (some TFTs particularly used in the drive circuit) preferably has enhancement characteristics in which the threshold voltage Vth is positive. As a result, circuit malfunction can be further securely suppressed, and lowering of yield can be further reduced.

The present embodiment can be also suitably applied to an active matrix substrate used in the organic EL display device. In the active matrix substrate used in the organic EL display device, a pixel circuit including at least a drive TFT and a selection TFT is provided in one pixel. The oxide semiconductor layers of the drive TFT and the selection TFT are disposed on the lower insulating layer 5 having the layered structure as described above, so that stable TFT characteristics can be realized. This is particularly advantageous in that depletion of the drive TFT can be suppressed.

Material and Thickness of Each Layer in Lower Insulating Layer 5

The upper layer 5U is the silicon oxide layer mainly containing silicon oxide. In the present specification, "silicon oxide" includes a compound represented by SiOx ($1 \leq x \leq 2$). The upper layer 5U is preferably in direct contact with the oxide semiconductor layer 7. The thickness of the upper layer 5U is not particularly limited, but may be, for example, 15 nm or greater and 100 nm or less (for example 50 nm). In a case of the thickness of 15 nm or greater, oxygen deficiency generated in the channel region 7c of the oxide semiconductor layer 7 can be more effectively reduced. In a case of the thickness of 100 nm or less, the capacitance of the lower insulating layer 5 functioning as the gate insulating layer can be decreased, so that the on characteristics of the TFT 101 can be improved. Throughput at the time of manufacturing can be increased.

The intermediate layer 5m is the insulating layer containing silicon and nitrogen, and is preferably the silicon nitride layer. Note that in the present specification, "silicon nitride" includes a compound represented by SiNx ($0.5 \leq x \leq 1.5$). The thickness of the intermediate layer 5m is not particularly limited, but may be, for example, 20 nm or greater and 100 nm or less (for example 50 nm). In a case of the thickness of 20 nm or greater, hydrogen can be more effectively prevented from entering the oxide semiconductor layer 7 from the lower layer 5L, and thus the reliability can be improved. In a case of the thickness of 100 nm or less, lowering of throughput at the time of manufacturing can be suppressed.

The lower layer 5L contains at least silicon, nitrogen, and oxygen. The concentration of oxygen in the lower layer 5L may be lower than the concentration of oxygen in the upper layer 5U and higher than the concentration of oxygen in the intermediate layer 5m. For example, the lower layer 5L may be a silicon nitride oxide (SiNxOy; $x>y>0$) layer containing nitrogen at a higher concentration than oxygen or a silicon oxynitride (SiOyNx; $y>x>0$) layer containing nitrogen at a lower concentration than oxygen. As an example, the lower layer 5L may preferably be the silicon nitride oxide (SiNxOy; $x>y>0$) layer, so that a refractive index difference between the lower layer 5L and the intermediate layer 5m can be reduced.

Ratios of oxygen and nitrogen in the intermediate layer 5m and the lower layer 5L are preferably set such that a refractive index nL of the lower layer 5L is higher than a refractive index n1 of the substrate 1 and lower than a refractive index nm of the intermediate layer 5m ($n1<nL<nm$). As a result, the refractive index difference at an interface between the lower insulating layer 5 and the substrate 1 can be reduced, and thus optical interference occurring at the interface between the substrate 1 and the lower insulating layer 5 can be reduced. Thus, variation in color (for example, when the refractive index difference is large, the color may be reddish) when the active matrix substrate 1001 is applied to the display device is suppressed. Loss of light transmittance due to the optical interference at the interface can also be reduced. As an example, when a glass substrate is used as the substrate 1, the refractive index n1 of the glass substrate is about 1.5. The refractive index nm of the silicon nitride layer serving as the intermediate layer 5m is about 1.9. When the silicon nitride oxide (SiNxOy; $x>y>0$) layer or the silicon oxynitride (SiOyNx; $y>x>0$) layer is used as the lower layer 5L, the refractive index nL of the lower layer 5L may be greater than 1.5 and less than 1.9. In this case, as the nitrogen concentration is higher, the refractive index nL becomes closer to the refractive index nm of the silicon nitride layer. The refractive index nL may be, for example, 1.7 or greater and less than 1.9.

A refractive index nU of the upper layer 5U may be smaller than the refractive indices nm and nL of the intermediate layer 5m and the lower layer 5L. For example, nU<nL<nm may be satisfied. The refractive index nL of the silicon oxide layer serving as the upper layer 5U is, for example, about 1.5.

The hydrogen desorption amount per unit thickness of the lower layer 5L is larger than the hydrogen desorption amount per unit thickness of the intermediate layer 5m. Note that the hydrogen desorption amount may vary depending on the material, formation method, and formation conditions of each layer. For example, as the film formation rate (hereinafter, referred to as "deposition rate") increases, the concentration of hydrogen atoms in the film tends to be higher, and the hydrogen desorption amount also tends to be larger. As the substrate temperature during film formation (hereinafter referred to as "deposition temperature") is lower, the concentration of hydrogen atoms in the film tends to be higher, and the hydrogen desorption amount tends to be larger.

Both the lower layer 5L and the intermediate layer 5m may be formed by a CVD, and the deposition rate of the lower layer 5L may be higher than the deposition rate of the intermediate layer 5m. In this case, the hydrogen desorption amount in the lower layer 5L may be larger than the hydrogen desorption amount in the intermediate layer 5m. The film density of the lower layer 5L may be lower than the film density of the intermediate layer 5m.

The lower layer 5L may be thicker than the intermediate layer 5m. Further, the lower layer 5L may be thicker than the upper layer 5U. When the film formation rate of the lower layer 5L is higher than that of the other layers, the throughput at the time of manufacturing can be increased by increasing the thickness of the lower layer 5L. The thickness of the lower layer 5L is, for example, three times or more of the thickness of the intermediate layer 5m. On the other hand, when the lower layer 5L is too thick, the hydrogen amount contained in the lower layer 5L increases, and the variation in TFT characteristics due to hydrogen may not be sufficiently suppressed by the intermediate layer 5m. Thus, the thickness of the lower layer 5L may be, for example, ten times or less of the thickness of the intermediate layer 5m.

Alternatively, the intermediate layer 5m may be thicker than the lower layer 5L. The intermediate layer 5m may also be thicker than the upper layer 5U. The dielectric constant of the lower insulating layer 5 is increased by increasing the thickness of the intermediate layer 5m, and thus the on characteristics of the TFT 101 having the lower insulating layer 5 serving as the gate insulating layer can be increased. Since the lower layer 5L having the large hydrogen desorption amount becomes relatively thin, the hydrogen desorption amount in the entire lower insulating layer 5 can be reduced, and more stable TFT characteristics can be obtained. As an example, the thicknesses of the intermediate layer 5m may be 300 nm, and the thicknesses of the upper layer 5U and the lower layer 5L may be 50 nm.

Analysis of Silicon Nitride Layer and Silicon Nitride Oxide Layer

The hydrogen desorption amount in the silicon nitride layer and the silicon nitride oxide layer can be measured by, for example, the thermal desorption spectroscopy analysis (TDS analysis). The hydrogen content of each layer can be measured by Fourier transform infrared spectroscopy (FT-IR), time-of-flight secondary ion mass spectrometer (TOF-SIMS), or the like. Among them, the TOF-SIMS analysis can be used to measure the hydrogen concentration of the silicon nitride layer and/or the silicon nitride oxide layer included in a product (for example, the active matrix substrate).

Here, the hydrogen desorption amount and the hydrogen bonding amount of each single film of the silicon nitride layer and the silicon nitride oxide layer were measured by TDS analysis and FT-IR analysis.

First, as measurement samples, a glass substrate on which a single film of silicon nitride (SiNx) layer was formed by a plasma CVD and a glass substrate on which a single film of silicon nitride oxide (SiNxOy) layer was formed by the plasma CVD were prepared. The thickness, formation method, and formation condition of each of the SiNx layer and the SiNxOy layer are shown in Table 1. The compositions of the SiNx layer and the SiNxOy layer are also shown in Table 1.

Next, the refractive indices of the SiNx layer and the SiNxOy layer at wavelengths 633 nm were measured using an ellipsometer. The measurement temperature was 25° C. The results are also shown in Table 1. From this result, it is confirmed that the refractive index of the SiNxOy layer is smaller than the refractive index of the SiNx layer and larger than the refractive index of the silicon oxide layer (for example, about 1.50).

Subsequently, the densities (pieces/cm$^3$) of Si—H bonds and N—H bonds in each of the SiNx layer and the SiNxOy layer were measured by FT-IR analysis. The results are also shown in Table 1.

Figure 3:
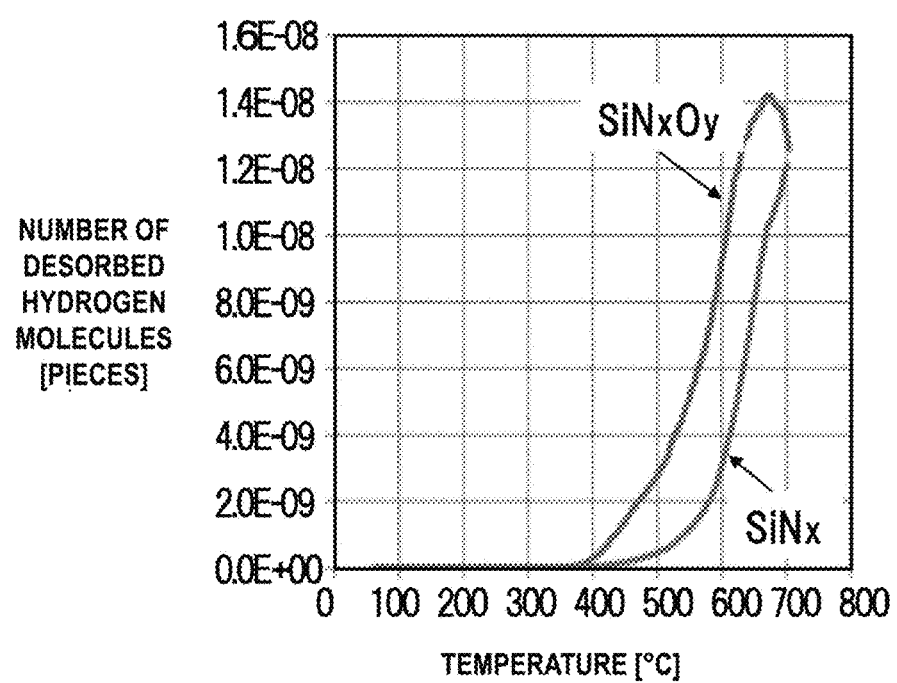
FIG. 3 is a diagram showing hydrogen desorption amounts from a SiNx layer and a SiNxOy layer by TDS analysis.

Subsequently, the hydrogen amounts desorbed from the SiNx layer and the SiNxOy layer were measured by TDS analysis. The results are shown in FIG. 3. TDS analysis was performed by increasing the temperature of each sample from 25° C. to 700° C. The horizontal axis of the graph shown in FIG. 3 represents the measurement temperature. The vertical axis represents the number (pieces) of desorbed molecules of hydrogen per a glass substrate having weight of 100 mg, and a layer to be measured (SiNx layer or SiNxOy layer) having a thickness of 300 nm.

In the temperature range from 25° C. to 600° C., the hydrogen desorption amount from each of the SiNx layer and the SiNxOy layer was integrated to obtain the integrated number of desorbed hydrogen molecules (pieces/cm$^2$) per unit thickness (here, 300 nm) of the layer to be measured (SiNx layer or SiNxOy layer), as the hydrogen desorption amount in the above temperature range. The results are shown in Table 1 and FIG. 4.

TABLE 1

|  | SiNx layer | SiNxOy layer |
| --- | --- | --- |
| Thickness of insulating layer | 300 nm | 300 nm |
| Formation method of insulating layer | Plasma CVD 1.88 nm/second | Plasma CVD 2.46 nm/second |
| Formation conditions: Deposition rate Deposition temperature | 350° C. | 350° C. |
| Composition | X: 1.1 | x: 0.8 y: 0.5 |
| Refractive index of insulating layer | 1.916 | 1.706 |
| Hydrogen bonding amount Si—H N—H | 1.724 × 10$^{21}$ pieces/cm$^3$ 7.820 × 10$^{21}$ pieces/cm$^3$ | 1.139 × 10$^{21}$ pieces/cm$^3$ 8.304 × 10$^{21}$ pieces/cm$^3$ |
| Total | 9.544 × 10$^{21}$ pieces/cm$^3$ | 9.444 × 10$^{21}$ pieces/cm$^3$ |

TABLE 1-continued

| | SiNx layer | SiNxOy layer |
|---|---|---|
| Integrated number of desorbed hydrogen molecules from 25° C. to 600° C. | $1.39 \times 10^{16}$ pieces/cm$^2$ | $3.86 \times 10^{16}$ pieces/cm$^2$ |

From the results shown in Table 1, it is confirmed that, in the sample used in this measurement, the hydrogen desorption amount per unit surface area of the SiNxOy layer (having a thickness of 300 nm) is larger than the hydrogen desorption amount of the SiNx layer (having a thickness of 300 nm).

According to the above results, the hydrogen bonding amount of the SiNxOy layer is smaller than that of the SiNx layer, but the hydrogen desorption amount of the SiNxOy layer is larger than that of the SiNx layer. It is considered that this is because the ratio of desorbed hydrogen among the bonded hydrogen is higher in the SiNxOy layer. Note that a magnitude relationship of the hydrogen bonding amount is not particularly limited. A deterioration of the oxide semiconductor layer may be caused by hydrogen desorbed from each insulating layer. For this reason, regardless of the hydrogen bonding amount, the layer having the small hydrogen desorption amount (here, the SiNx layer) is disposed closer to the oxide semiconductor layer 7 than the layer having the large hydrogen desorption amount (here, the SiNxOy layer), and thus the entry of hydrogen into the oxide semiconductor layer can be suppressed, and the deterioration of the oxide semiconductor layer (reduction of the oxide semiconductor) can be suppressed.

Note that the values of the hydrogen desorption amounts, the hydrogen bonding amounts, the refractive indices, and the like in the SiNx layer and the SiNxOy layer are not limited to the values shown in Table 1, and may vary depending on the composition, the formation method, the conditions, and the like of each layer.

Figure 4:
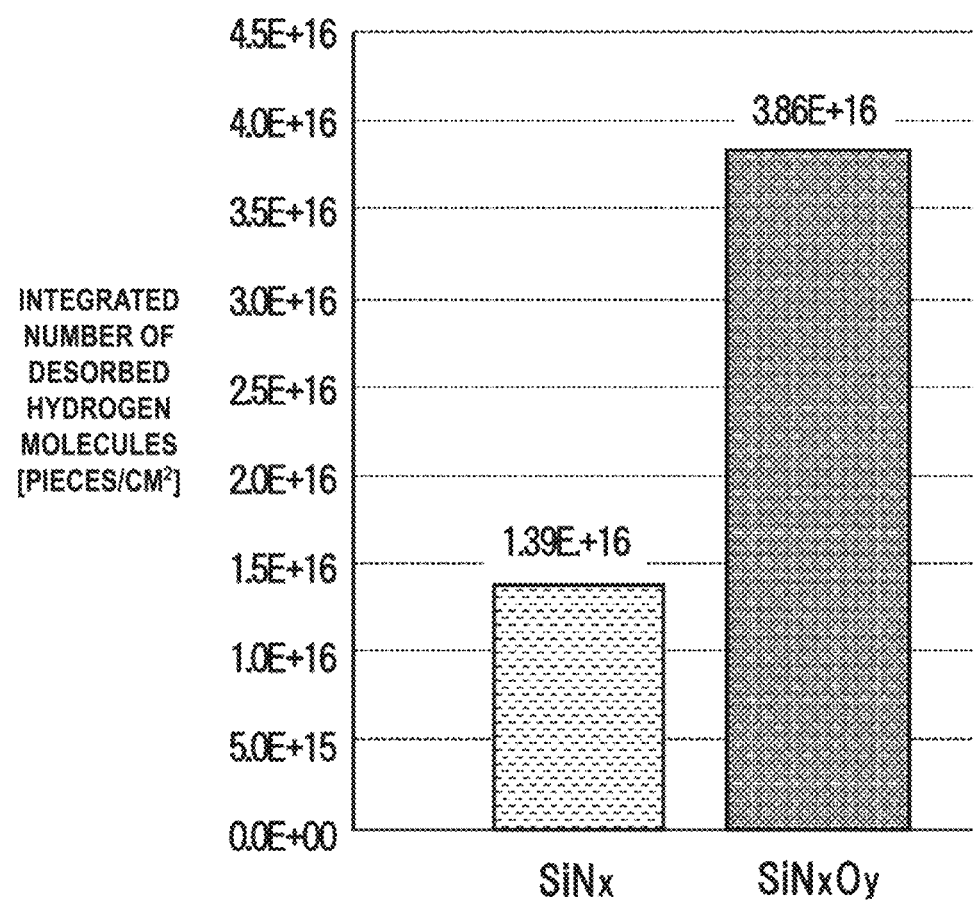
FIG. 4 is a diagram showing integrated amount of desorbed hydrogen molecules from the SiN layer and a SiNO layer.

The results shown in Table 1, FIG. 3, and FIG. 4 are measurement results for the single film of SiNxOy layer or SiNx layer, but the hydrogen concentration of each layer in the lower insulating layer can also be measured by analyzing the product (TFT or active matrix substrate). For example, TOF-SIMS can be used to analyze the product.

Manufacturing Method of Active Matrix Substrate 1001

A manufacturing method of an active matrix substrate according to the present embodiment will be described by taking the active matrix substrate 1001 as an example.

FIGS. 5A to 5G are process cross-sectional views for describing the manufacturing method of the active matrix substrate 1001. In one unit region out of a plurality of unit regions in the active matrix substrate 1001, the manufacturing method will be described below. Note that at least one of the circuit TFTs formed in the non-display region can be manufactured by a method similar to that of the pixel TFT described below.

Figure 5A:
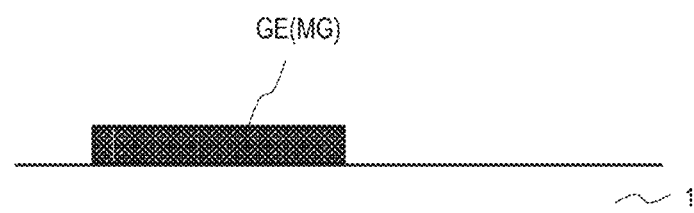
FIG. 5A is a process cross-sectional view illustrating a manufacturing method of the active matrix substrate 1001.

Step 1: Formation of Gate Metal Layer MG (FIG. 5A)

A first conductive film (having a thickness of 50 nm or greater and 500 nm or less, for example) is formed on the substrate 1 by sputtering, for example. Next, the first conductive film is patterned by a known photolithography process. In this manner, as illustrated in FIG. 5A, the gate metal layer MG including the gate bus line GL and the gate electrode GE of each TFT is formed.

As the substrate 1, a transparent substrate with insulating properties, for example, a glass substrate, a silicon substrate, a heat-resistant plastic substrate (resin substrate), or the like can be used.

The material of the first conductive film is not particularly limited, and for example, a film containing a metal such as aluminum (Al), tungsten (W), molybdenum (Mo), tantalum (Ta), chromium (Cr), titanium (Ti), and copper (Cu), an alloy thereof, or a metal nitride thereof can be appropriately used. A layered film obtained by layering these plurality of films may also be used. Here, as the first conductive film, a layered film having Ti as a lower layer and Cu as an upper layer is used.

Step 2: Formation of Lower Insulating Layer 5 (FIG. 5B)

Figure 5B:
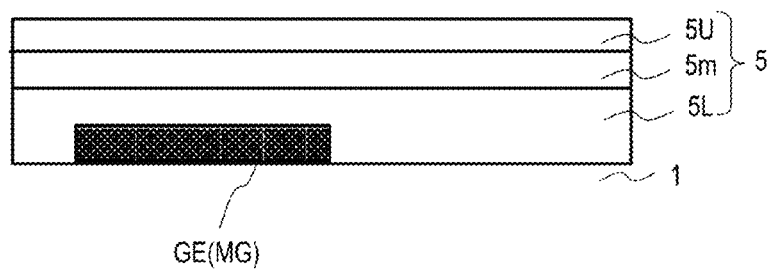
FIG. 5B is a process cross-sectional view illustrating the manufacturing method of the active matrix substrate 1001.

Subsequently, as illustrated in FIG. 5B, the lower insulating layer 5 (having a thickness of, for example, 200 nm or greater and 600 nm or less) is formed to cover the gate metal layer MG.

The lower insulating layer 5 may be formed at a temperature from 300° C. to 400° C. (for example, 350° C.) using, for example, a plasma CVD apparatus. In this example, the lower insulating layer 5 having a triple-layer structure is obtained by forming the lower layer 5L, the intermediate layer 5m, and the upper layer 5U in this order. Note that the lower insulating layer 5 is only necessary to include the lower layer 5L, the intermediate layer 5m, and the upper layer 5U in this order, and may have a layered structure of four or more layers.

In this example, as the lower layer 5L, the silicon nitride oxide layer is formed at a first deposition rate. As the intermediate layer 5m, the silicon nitride layer is formed at a second deposition rate lower than the first deposition rate. As the upper layer 5U, the silicon oxide layer is formed. The intermediate layer 5m and the upper layer 5U are preferably thinner than the lower layer 5L. The first deposition rate may be from about 1.1 times to about 1.5 times (for example, 1.3 times) of the second deposition rate. Note that, as the lower layer 5L and the intermediate layer 5m, the silicon nitride layers may be formed. In this case, the intermediate layer 5m may be formed at a deposition rate lower than the lower layer 5L to make the hydrogen desorption amount in the intermediate layer 5m smaller than the hydrogen desorption amount in the lower layer 5L.

Figure 5C:
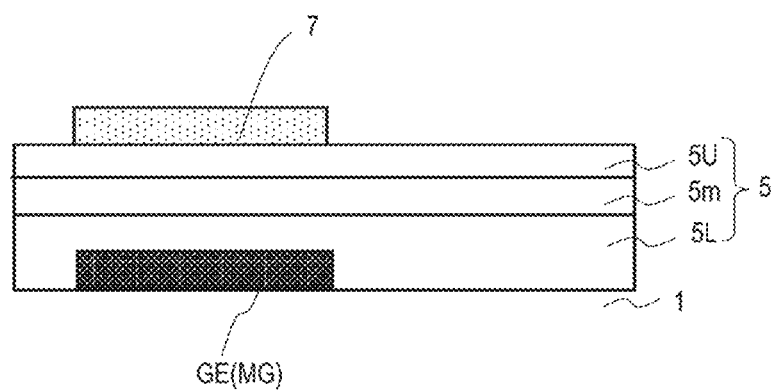
FIG. 5C is a process cross-sectional view illustrating the manufacturing method of the active matrix substrate 1001.

Step 3: Formation of Oxide Semiconductor Layer 7 (FIG. 5C)

Subsequently, the oxide semiconductor film (having a thickness of, for example, 15 nm or greater and 200 nm or less) is formed on the lower insulating layer 5. Thereafter, an annealing treatment of the oxide semiconductor film may be performed. Subsequently, the oxide semiconductor film is patterned by a known photolithography process. In this manner, as illustrated in FIG. 5C, the oxide semiconductor layer 7 to be an active layer of the TFT 101 is obtained. When viewed from the normal direction of the substrate 1, at least a portion to be the channel region of the oxide semiconductor layer 7 overlaps with the gate electrode GE.

The oxide semiconductor film may be formed by sputtering, for example. Here, as the oxide semiconductor film, an In—Ga—Zn—O-based semiconductor film (having a thickness of 50 nm) containing In, Ga, and Zn is formed. Patterning of the oxide semiconductor film may be, for example, performed by wet etching using a PAN-based etching solution containing phosphoric acid, nitric acid, and acetic acid.

Figure 5D:
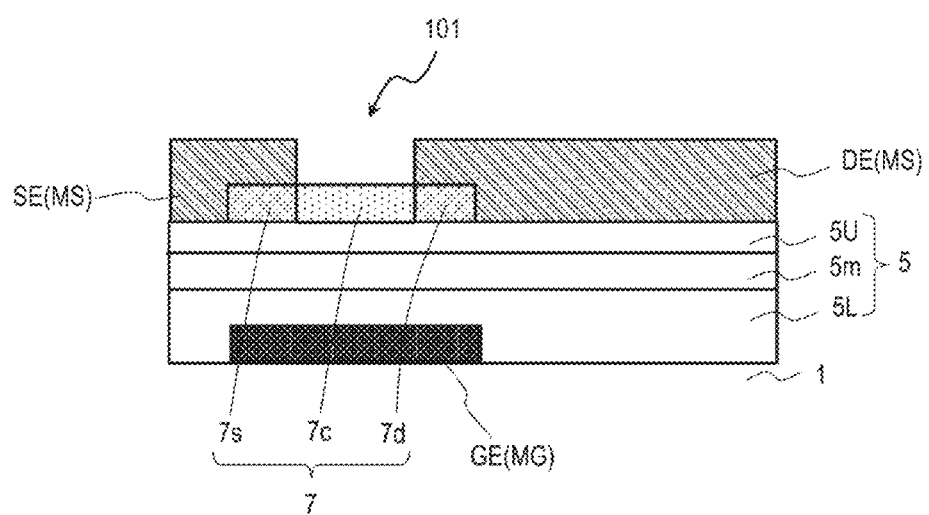
FIG. 5D is a process cross-sectional view illustrating the manufacturing method of the active matrix substrate 1001.

Step 4: Formation of Source Metal Layer (FIG. 5D)

Subsequently, the second conductive film (having a thickness of, for example, 50 nm or greater and 500 nm or less) is formed so as to cover the oxide semiconductor layer 7, and the second conductive film is patterned. As illustrated in FIG. 5D, this forms the source metal layer MS including the source electrode SE and the drain electrode DE of the pixel TFT, and the source bus line SL. The source electrode SE and the drain electrode DE may be disposed so as to be in contact with an upper face of the oxide semiconductor layer 7. In this manner, the TFT 101 is obtained.

Here, as the second conductive film, for example, an element selected from aluminum (Al), chromium (Cr), copper (Cu), tantalum (Ta), titanium (Ti), molybdenum (Mo), and tungsten (W), or an alloy containing some of these elements can be used. The second conductive film may have a triple-layer structure in which a Ti film, a TiN film, or a Mo film is used as an upper layer and a lower layer, and an Al film or a Cu film serves as a main layer. For example, the second conductive film may have a triple-layer structure such as titanium film-aluminum film-titanium film or molybdenum film-aluminum film-molybdenum film. Note that the second conductive film is not limited to the triple-layer structure, and may have a single layer or a dual-layer structure, or a layered structure of four or more layers.

Step 5: Formation of Upper Insulating Layer 13 (FIG. 5E)

Figure 5E:
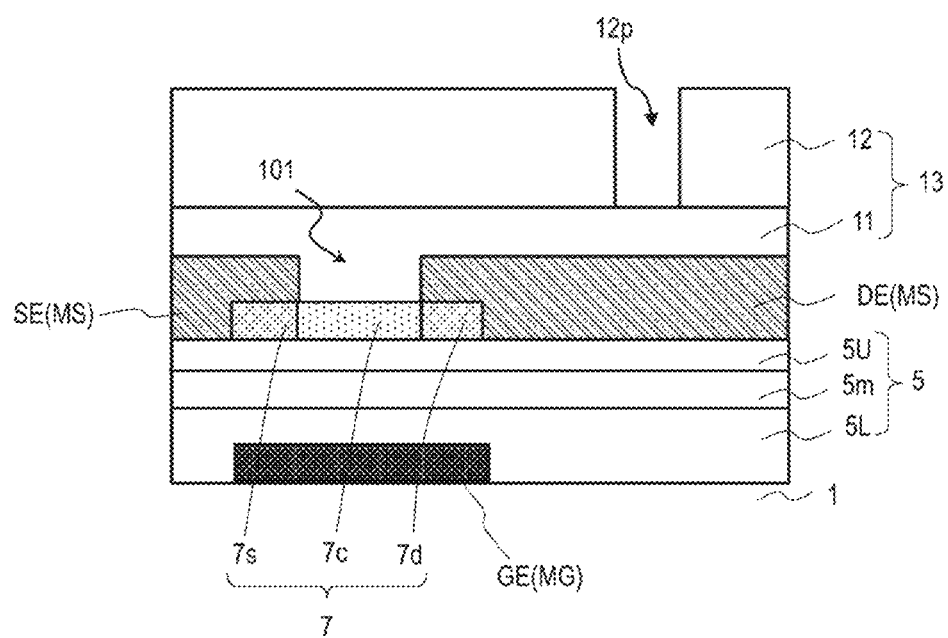
FIG. 5E is a process cross-sectional view illustrating the manufacturing method of the active matrix substrate 1001.

Next, as illustrated in FIG. 5E, the upper insulating layer 13 that covers the source metal layer MS is formed. Here, as the upper insulating layer 13, a layered film including the inorganic insulating layer 11 and the organic insulating layer 12 is formed.

As the inorganic insulating layer 11, an insulating film such as the silicon oxide film, the silicon nitride film, the silicon oxynitride film, or the silicon nitride oxide film, or a layered film of these insulating films can be formed by, for example, the CVD. The thickness of the inorganic insulating layer 11 may be 100 nm or greater and 500 nm or less. In this example, the inorganic insulating layer 11 is in contact with the channel region 7c. In this case, an oxide film such as the silicon oxide film is preferable to be used as the inorganic insulating layer 11, so that the resistance lowering due to oxygen deficiency in the channel region 7c can be suppressed. Here, as the inorganic insulating layer 11, for example, the silicon oxide layer having a thickness of 300 nm is used.

The thickness of the organic insulating layer 12 is, for example, from 1 μm to 4 μm, and preferably from 2 μm to 3 μm. Here, as the organic insulating layer 12, an organic insulating film containing a photosensitive resin material (for example, an acrylic transparent resin film) having a thickness of 2 μm is used.

Thereafter, the organic insulating layer 12 is patterned. In this manner, in each pixel region, an opening 12p for exposing a part of the inorganic insulating layer 11 is formed in the organic insulating layer 12. The opening 12p is disposed on a part of the drain electrode DE when viewed from the normal direction of the substrate 1.

Step 6: Formation of Common Electrode CE (FIG. 5F)

Figure 5F:
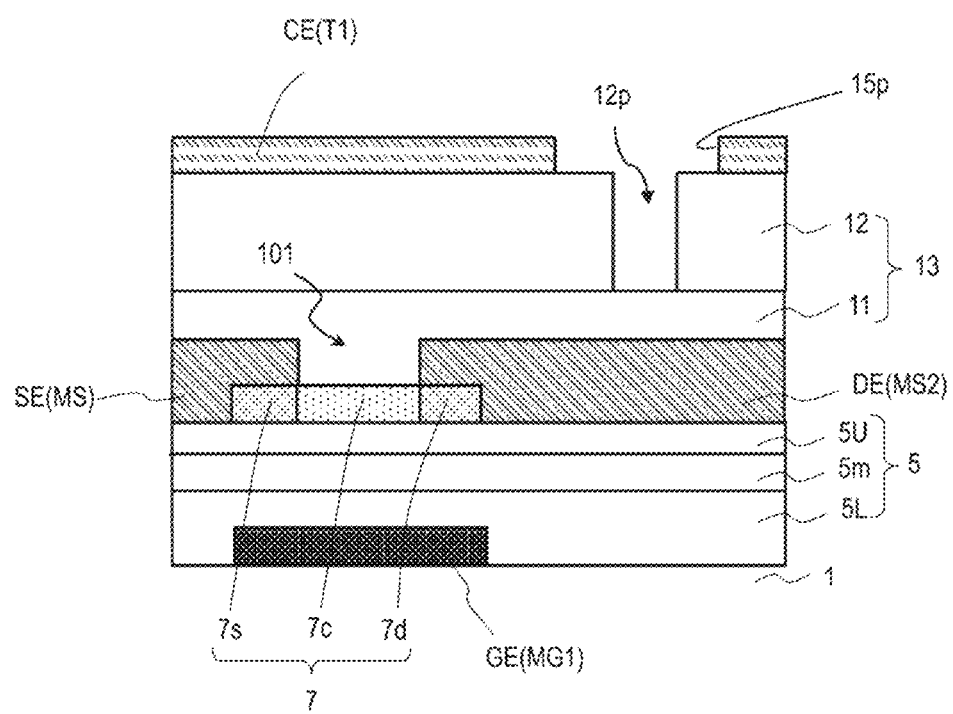
FIG. 5F is a process cross-sectional view illustrating the manufacturing method of the active matrix substrate 1001.

Subsequently, as illustrated in FIG. 5F, a first transparent conductive film (having a thickness from 20 to 300 nm) (not illustrated) is formed on the organic insulating layer 12 and patterned to form the common electrode CE. The common electrode CE includes the opening 15p for exposing the opening 12p.

As the first transparent conductive film, a metal oxide such as indium-zinc oxide, indium-tin oxide (ITO), ZnO, or the like can be used. Here, indium-tin oxide (ITO) film having a thickness of 70 nm is used.

Step 7: Formation of Dielectric layer 17 and Pixel contact Hole CHp (FIG. 5G)

Figure 5G:
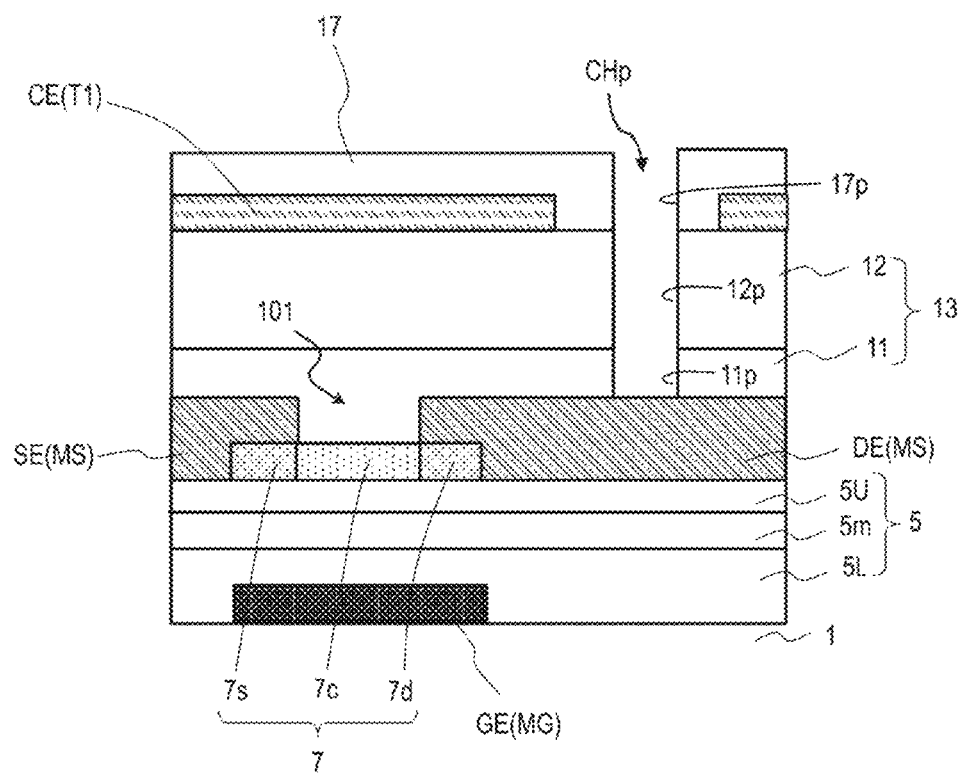
FIG. 5G is a process cross-sectional view illustrating the manufacturing method of the active matrix substrate 1001.

Subsequently, as illustrated in FIG. 5G, the dielectric layer (having a thickness from 50 to 500 nm) 17 is formed so as to cover the common electrode CE. A material of the dielectric layer 17 may be the same as the material exemplified as the material of the inorganic insulating layer 11. Here, as the dielectric layer 17, for example, a SiN film (having a thickness of 300 nm) is formed by the CVD.

Subsequently, a resist layer (not illustrated) is provided on the dielectric layer 17, and the dielectric layer 17 and the inorganic insulating layer 11 are patterned. As a result, as illustrated, in each pixel region, an opening 17p is formed in the dielectric layer 17, and an opening 11p for exposing a part of the drain electrode DE is formed in the inorganic insulating layer 11. The inorganic insulating layer 11 is etched using the resist layer and the organic insulating layer 12 as masks. When viewed from the normal direction of the substrate 1, the openings 17p, 12p, and 11p at least partially overlap with each other. In this way, a pixel contact hole CHp constituted of the openings 17p, 12p and 11p is obtained.

Note that, here, the method of patterning the inorganic insulating layer 11 at the same time as the dielectric layer 17 is described, but instead, after the organic insulating layer 12 is formed and before the dielectric layer 17 is formed, patterning of the inorganic insulating layer 11 may be performed using the organic insulating layer 12 as the mask.

Step 8: Formation of Pixel Electrode PE (FIGS. 2A and 2B)

Subsequently, a second transparent conductive film (having a thickness from 20 to 300 nm) (not illustrated) is formed on the dielectric layer 17. The second transparent conductive film can be formed using a material similar to that of the first transparent conductive film. Here, indium-tin oxide (ITO) film having a thickness of 70 nm is used. Thereafter, the second transparent conductive film is patterned. In this manner, the pixel electrode PE is formed in each pixel region. In this manner, the active matrix substrate 1001 illustrated in FIGS. 2A and 2B is manufactured.

In the example illustrated in FIGS. 2A and 2B, the TFT 101 has an channel etch structure, but instead, may have an etch stop structure. In an "etch stop type TFT", an etch stop layer is formed on the channel region of the oxide semiconductor layer. The lower face of the end portion of each of the source and drain electrodes, which is closer to the channel, is positioned on the etch stop layer, for example. The etch stop type TFT is formed, for example, by forming the etch stop layer covering a portion to be the channel region of the oxide semiconductor layer, then forming the conductive film for the source and drain electrodes on the oxide semiconductor layer and the etch stop layer, and performing the source/drain separation.

Examples and Comparative Examples

Next, a measurement sample in which the lower insulating layer having the layered structure was formed on the substrate was prepared, and a composition of each layer in the lower insulating layer was examined.

Figure 6A:
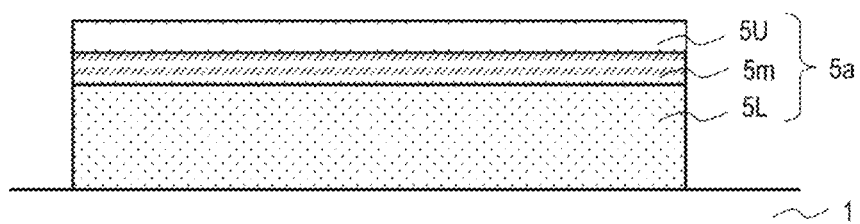
FIG. 6A is a cross-sectional view illustrating a lower insulating layer 5a according to an example 1.
Figure 6B:
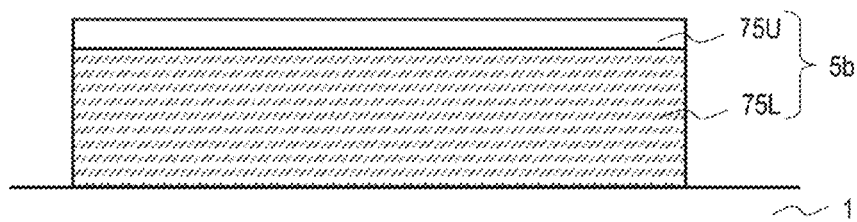
FIG. 6B is a cross-sectional view illustrating a lower insulating layer 5b according to a comparative example 1.
Figure 6C:
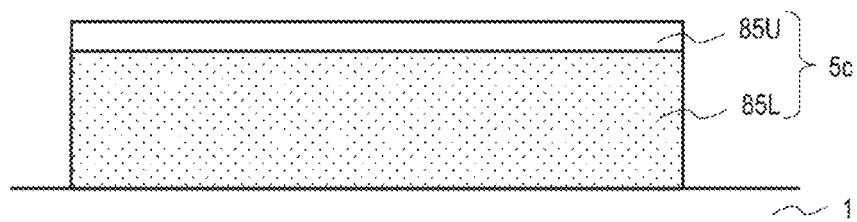
FIG. 6C is a cross-sectional view illustrating a lower insulating layer 5c according to a comparative example 2.

FIG. 6A, FIG. 6B, and FIG. 6C are cross-sectional views illustrating substrates provided with respective lower insulating layers 5a to 5c of an example 1 and comparative examples 1 and 2. The lower insulating layer 5a of the example 1 has a triple-layer structure similar to that in FIG. 2B. Each of the lower insulating layers 5b and 5c of the comparative examples 1 and 2 has a dual-layer structure including an upper layer and a lower layer.

The lower insulating layer 5a of the example 1 illustrated in FIG. 6A has a triple-layer structure including a SiNxOy layer as the lower layer 5L, a SiNx layer as the intermediate layer 5m, and a SiOx layer as the upper layer 5U. Here, the lower insulating layer 5 was formed at a temperature of 350° C. using the plasma CVD. The lower layer 5L was formed at a deposition rate higher than that of the intermediate layer 5m. A hydrogen desorption amount c1 of the lower layer 5L is larger than a hydrogen desorption amount c2 of the intermediate layer 5m (see FIGS. 3 and 4).

The lower insulating layer 5b of the comparative example 1 illustrated in FIG. 6B has a dual-layer structure including the SiNx layer as a lower layer 75L and the SiOx layer as an upper layer 75U. The formation method and formation conditions (deposition rate, deposition temperature) of the upper layer 75U and the lower layer 75L were the same as those of the upper layer 5U and the intermediate layer 5m, respectively, of the lower insulating layer 5a of the example 1. Thus, a hydrogen desorption amount of the lower layer 75L is about the same as the hydrogen desorption amount c2 of the intermediate layer 5m in the example 1, which is considered to be relatively low.

The lower insulating layer 5c of the comparative example 2 illustrated in FIG. 6C has a dual-layer structure including the SiNxOy layer as a lower layer 85L and the SiOx layer as an upper layer 85U. The formation method and formation conditions (deposition rate, deposition temperature) of the upper layer 85U and the lower layer 85L were the same as those of the upper layer 5U and the lower layer 5L, respectively, of the lower insulating layer 5a of the example 1. Thus, a hydrogen desorption amount of the lower layer 85L is about the same as the hydrogen desorption amount c1 of the lower layer 5L in the example 1, which is considered to be relatively high.

The structures of the lower insulating layers 5a to 5c in the example 1 and comparative examples 1 and 2 and the thickness of each layer are shown in Table 2.

TABLE 2

| | Structure of lower insulating layer | Thickness (nm) | Deposition rate (nm/sec) | Hydrogen desorption amount |
|---|---|---|---|---|
| Example 1 | Upper layer: SiOx | 50 | | |
| | Intermediate layer: SiNx | 50 | 1.88 | c1 (small) |
| | Lower layer: SiNxOy | 300 | 2.46 | c2 (large) |
| Comparative example 1 | Upper layer: SiOx | 50 | | |
| | Lower layer: SiNx | 350 | 1.88 | c1 (small) |
| Comparative example 2 | Upper layer: SiOx | 50 | | |
| | Lower layer: SiNxOy | 350 | 2.46 | c2 (large) |

Composition analysis of the lower insulating layers 5a to 5c in the example 1 and comparative examples 1 and 2 was performed using X-ray photoelectron spectroscopy (XPS). The analysis results are shown in Table 3.

TABLE 3

| | Structure of lower insulating layer | Si (at %) | O (at %) | N (at %) |
|---|---|---|---|---|
| Example 1 | Upper layer: SiOx | 33.1 | 66.9 | |
| | Intermediate layer: SiNx | 47.3 | | 52.7 |
| | Lower layer: SiNxOy | 42.7 | 22.8 | 34.6 |
| Comparative example 1 | Upper layer: SiOx | 33.6 | 66.4 | |
| | Lower layer: SiNx | 47.6 | | 52.4 |
| Comparative example 2 | Upper layer: SiOx | 33.1 | 66.9 | |
| | Lower layer: SiNxOy | 42.5 | 23.4 | 34.1 |

Next, the characteristics of the bottom gate type TFTs using the lower insulating layers 5a to 5c of the example 1 and comparative examples 1 and 2 as the gate insulating layers were compared. It was found that the threshold voltage Vth of the TFT using the lower insulating layer 5c in the comparative example 2 was 1.3V, a shift of the threshold voltage Vth of which in the negative direction was larger than a shift of the threshold voltage Vth (about 2V) of each of the TFTs using the lower insulating layers 5a and 5b in the example 1 and comparative example 1. The reason for this is considered that hydrogen entered the channel portion of the oxide semiconductor layer from the lower layer 85L having a large hydrogen desorption amount during the manufacturing process, and a part of the oxide semiconductor layer was reduced. On the other hand, in the TFT using the lower insulating layer 5a of the example 1, it is found that the intermediate layer 5m having a small hydrogen desorption amount (that is, hydrogen is less likely to be desorbed) interposed between the lower layer 5L and the oxide semiconductor layer allows the entry of hydrogen into the oxide semiconductor layer to be suppressed, and thus stable TFT characteristic can be obtained. In the TFT using the lower insulating layer 5a of the example 1, for example, TFT characteristics similar to those of the case where a layer having a relatively large hydrogen desorption amount is not formed (comparative example 1) can also be realized.

In the active matrix substrate using the lower insulating layer 5b of the comparative example 1, although the negative shift of the threshold voltage Vth can be suppressed, film formation of the lower layer 75L of the lower insulating layer 5b takes time, and the throughput may be reduced. In addition, the refractive index difference at the interface between the substrate 1 and the lower layer 75L (SiNx layer) is large, and thus a variation in tinge tends to occur due to optical interference. On the other hand, in the example 1, the film formation time of the lower insulating layer 5a can be shortened, and thus the throughput can be improved. In addition, the SiNxOy layer having an intermediate refractive index between the refractive index of the SiNx layer and the refractive index of the substrate 1 is disposed between the SiNx layer and the substrate 1, so that degradation of display characteristics due to the refractive index difference can be suppressed.

Second Embodiment

Figure 7A:
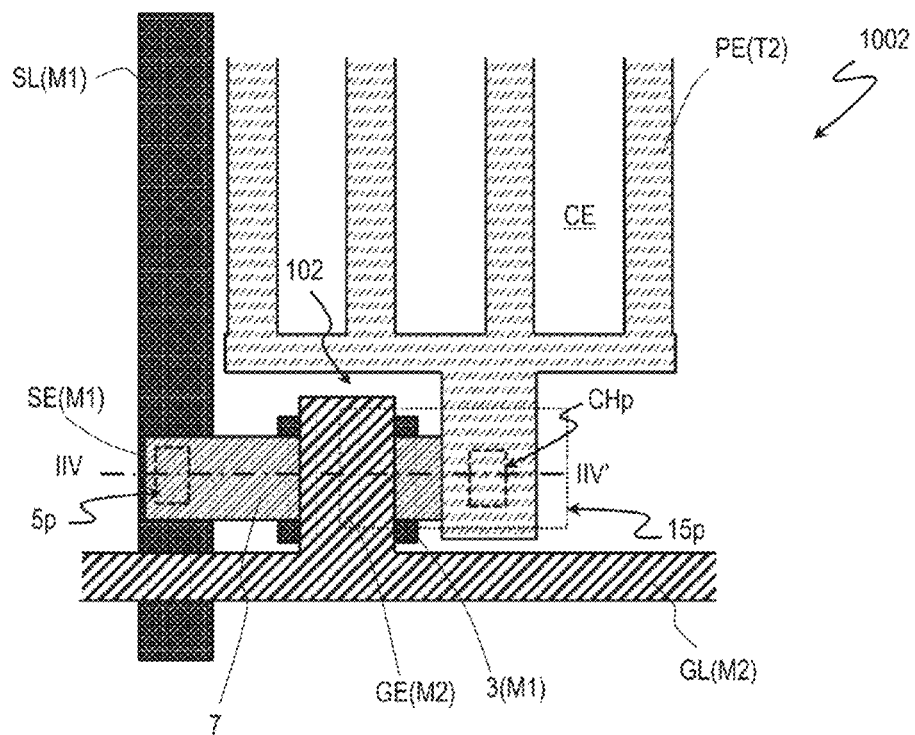
FIG. 7A is a plan view illustrating an example of one pixel region PIX in an active matrix substrate 1002 according to a second embodiment.
Figure 7B:
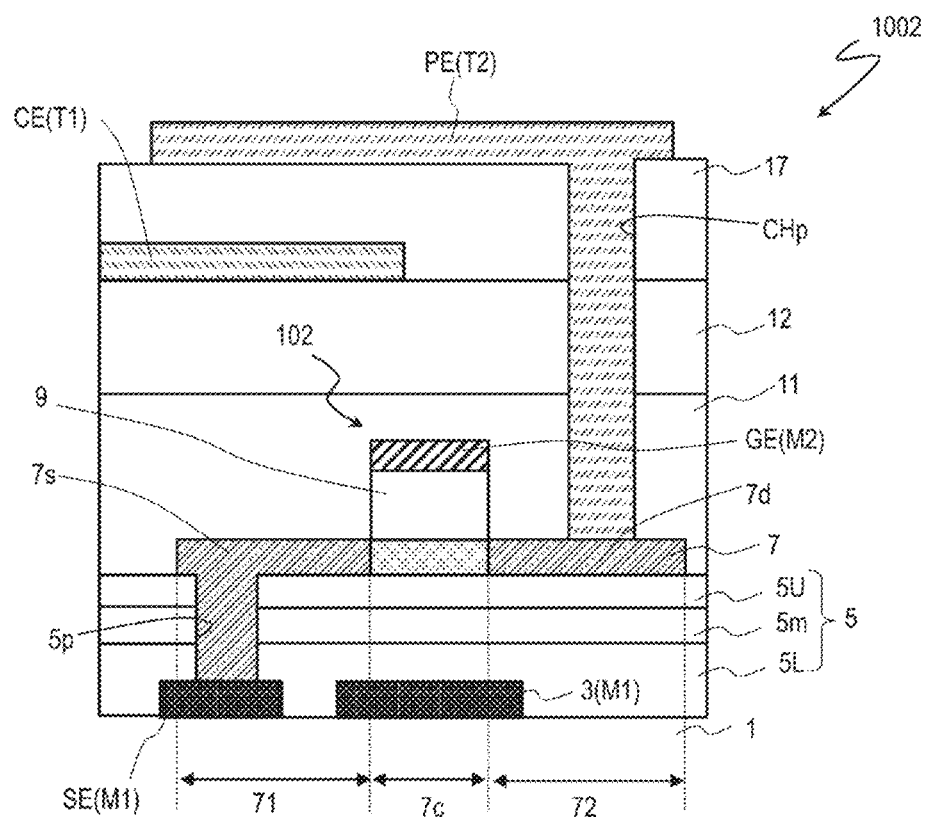
FIG. 7B is a cross-sectional view taken along a line IIV-IIV' in FIG. 7A.

FIG. 7A is a plan view illustrating an example of one pixel region PIX in an active matrix substrate 1002. FIG. 7B is a cross-sectional view taken along a line IIV-IIV' in FIG. 7A, illustrating a cross-sectional structure of a TFT (pixel TFT) 102 formed in the pixel region PIX.

The active matrix substrate 1002 differs from the active matrix substrate 1001 illustrated in FIGS. 2A and 2B, in that the TFT 102 has the top gate structure, and that the source bus lines SL are disposed in a layer lower (closer to the substrate 1) than the gate bus lines GL and the oxide semiconductor layer 7. Hereinafter, only the points different from the active matrix substrate 1001 will be described, and the description of the similar structure will be omitted.

First, a layer structure of the active matrix substrate 1002 will be described. The active matrix substrate 1002 includes a first metal layer M1, the lower insulating layer 5, the oxide semiconductor layer 7, a gate insulating layer 9, a second metal layer M2, the inorganic insulating layer 11, the organic insulating layer 12, the first transparent conductive layer T1, the dielectric layer 17, and the second transparent conductive layer T2 in this order from the substrate 1 side. In the present embodiment, the first metal layer M1 includes the plurality of source bus lines SL and the source electrode SE and a light blocking layer of each pixel TFT 102. The second metal layer M2 includes the plurality of gate bus lines GL and the gate electrode GE of each pixel TFT 102.

The TFT 102 includes the oxide semiconductor layer 7, the gate electrode GE disposed on a part of the oxide semiconductor layer 7 across the gate insulating layer 9, and the source electrode SE. In this example, a part of the pixel electrode PE functions as a drain electrode of the TFT 102, but the TFT 102 may include a drain electrode in a metal layer different from the pixel electrode PE.

The source electrode SE of each TFT 102 is electrically connected to the corresponding source bus line SL. As illustrated, the source electrode SE may be a part of the corresponding source bus line SL.

The lower insulating layer 5 covers the source electrode SE and the source bus line SL. The lower insulating layer 5 has a layered structure similar to that of the lower insulating layer 5 of the embodiment described above with reference to FIGS. 2A and 2B. Note that, in the present embodiment, the lower insulating layer 5 includes an opening 5p for exposing a part of the source electrode SE (source bus line SL) of each TFT 102.

The oxide semiconductor layer 7 includes the channel region 7c, and a first region 71 and a second region 72 positioned on both sides of the channel region 7c, when viewed from the normal direction of the substrate 1. The first region 71 and the second region 72 are low-resistive regions having specific resistance lower than that of the channel region 7c. The low-resistive region may be a conductor region. The first region 71 includes the source contact region 7s electrically connected to the source electrode SE, and the second region 72 includes the drain contact region 7d electrically connected to the drain electrode DE. When viewed from the normal direction of the substrate 1, the channel region 7c of the oxide semiconductor layer 7 is a region positioned between the first region 71 and the second region 72 and overlapping with the gate electrode GE. In this example, the oxide semiconductor layer 7 is disposed on the lower insulating layer 5 and in the opening 5p. The source contact region 7s of the oxide semiconductor layer 7 is connected to (here, in direct contact with) the source electrode SE in the opening 5p.

The gate insulating layer 9 is disposed on the channel region 7c. The gate insulating layer 9 may overlap with the channel region 7c but need not overlap with the first region 71 and the second region 72, when viewed from the normal direction of the substrate 1. In this example, the gate insulating layer 9 of each TFT 102 is disposed in an island shape only between the channel region 7c and the gate electrodes GE of the TFT 102, and is separated from the gate insulating layers of the other TFTs. Note that the gate insulating layer 9 may be continuously disposed so as to cover the upper face and the side surface of the oxide semiconductor layer 7 of each of the plurality of TFTs 102, and may include an opening for exposing a part (at least the drain contact region 7d) of the oxide semiconductor layer 7 of each of the TFTs 102.

The first region 71 and the second region 72 are formed, for example, by subjecting the oxide semiconductor layer 7 to a resistance lowering treatment such as a plasma treatment using the gate insulating layer 9 (and the gate electrode GE) as a mask. In this case, when viewed from the normal direction of the substrate 1, a boundary between the first region 71 and the channel region 7c and a boundary between the second region 72 and the channel region 7c may be substantially aligned with a peripheral edge of the gate insulating layer 9.

The gate electrode GE is formed in the second metal layer M2 and is electrically connected to the corresponding gate bus line GL. The gate electrode GE is disposed on the gate insulating layer 9, the gate electrode GE overlapping with at least a part of the channel region 7c but not overlapping with the source contact region 7s and the drain contact region 7d, when viewed from the normal direction of the substrate 1.

The TFT 102 may include a conductive layer 3 that functions as a light blocking layer closer to the substrate 1 of the oxide semiconductor layer 7. The conductive layer 3 is separated from the source bus line SL and the source electrode SE, for example, in the same first metal layer M1 as the source bus line SL. The conductive layer 3 may be disposed to overlap with at least the channel region 7c of the oxide semiconductor layer 7, when viewed from the normal direction of the substrate 1. In this manner, deterioration of characteristics of the oxide semiconductor layer 7 caused by light (backlight) from the substrate 1 side can be suppressed. The conductive layer 3 may be in an electrically floating state or may be fixed to the GND potential (0 V). Alternatively, the conductive layer 3 may function as a lower gate electrode by being electrically connected to the gate electrode GE by a connecting portion (not illustrated).

The oxide semiconductor layer 7, the gate insulating layer 9, and the gate electrode GE are covered with the inorganic insulating layer (passivation film) 11. The inorganic insulating layer 11 may be in direct contact with the first region 71 and the second region 72. In this case, the inorganic insulating layer 11 is preferably an insulating layer (for example, a hydrogen-donating layer such as a SiNx layer) that can reduce the oxide semiconductor. As illustrated, the organic insulating layer 12 may be provided on the inorganic insulating layer 11.

On the organic insulating layer 12, the pixel electrode PE and the common electrode CE are provided across the dielectric layer 17 in the same manner as in the embodiment described above. In this example, the common electrode CE is disposed in a layer lower (closer to the substrate 1) than the pixel electrode PE. In the pixel contact portion, the pixel contact hole CHp for exposing the drain contact region 7d of the oxide semiconductor layer 7 is formed in the dielectric layer 17, the organic insulating layer 12, and the inorganic insulating layer 11. The pixel electrode PE is electrically connected to the drain contact region 7d of the oxide semiconductor layer 7 in the pixel contact hole CHp. The pixel electrode PE may be in direct contact with the oxide semiconductor layer 7. In other words, a portion of the pixel electrode PE, which is in contact with the oxide semiconductor layer 7, may also function as the drain electrode.

Note that, the TFT 102 may include the drain electrode between the pixel electrode PE and the oxide semiconductor layer 7. The oxide semiconductor layer 7 and the pixel electrode PE may be electrically connected to each other via the drain electrode. For example, another metal layer (third metal layer) including the drain electrode of each pixel TFT 102 may be provided between the inorganic insulating layer 11 and the organic insulating layer 12. The oxide semiconductor layer 7 may be electrically connected to the source electrode SE or the source bus line SL in the first metal layer M1 by a connection electrode positioned in a layer upper than the oxide semiconductor layer 7.

The active matrix substrate 1002 includes the source bus line SL closer to the substrate 1 than the oxide semiconductor layer 7 and the gate bus line GL (lower source structure), but the source bus line SL may be disposed in a layer upper than the gate bus line GL. For example, another metal layer (third metal layer) including the source bus line SL and the source electrode SE of each pixel TFT may be formed between the inorganic insulating layer 11 and the organic insulating layer 12. Such a structure is disclosed, for example, in JP 2019-160829 A. The entire contents of the disclosure of JP 2019-160829 A are incorporated herein by reference.

Also in the present embodiment, the lower insulating layer 5 includes the intermediate layer 5m having the smaller hydrogen desorption amount than that of the lower layer 5L between the lower layer 5L and the upper layer 5U described above, and thus a change in the TFT characteristics due to hydrogen entering the oxide semiconductor layer 7 from the lower insulating layer 5 can be suppressed.

The active matrix substrate 1002 may be manufactured, for example, by the following method. Note that, in the following, points different from the manufacturing method of the active matrix substrate 1001 described above with reference to FIGS. 5A to 5G will be mainly described, and the description of the similar processes will be omitted. The material, thickness, formation method, formation conditions, and the like of each layer may be similar to those of the active matrix substrate 1001.

First, the first metal layer M1 including the source bus line SL, and the source electrode SE and the conductive layer 3 of each TFT 102 is formed on the substrate 1 using the third conductive film. As the third conductive film, a film containing a metal such as aluminum (Al), tungsten (W), molybdenum (Mo), tantalum (Ta), chromium (Cr), titanium (Ti), or copper (Cu), or an alloy thereof, or a metal nitride thereof, can be appropriately used. A layered film obtained by layering these plurality of films may also be used. Here, as the third conductive film, a layered film having Ti as a lower layer and Cu as an upper layer is used.

Then, the lower insulating layer 5 covering the first metal layer M1 is formed in the similar manner as described above with reference to FIG. 5B. When the conductive layer 3 functions as the lower gate electrode, the lower insulating layer 5 functions as the lower gate insulating layer. Thereafter, the lower insulating layer 5 is patterned to form the opening 5p for exposing a part of the source bus line SL (source electrode SE).

Subsequently, the oxide semiconductor layer 7 is formed on the lower insulating layer 5 and in the opening 5p. The oxide semiconductor layer 7 is connected to the source electrode SE in the opening 5p. The oxide semiconductor layer 7 may be in direct contact with the source electrode SE.

Subsequently, a gate insulating film (having a thickness of, for example, 80 nm or greater and 250 nm or less) and a fourth conductive film (having a thickness of, for example, 50 nm or greater and 500 nm or less) are formed in this order to cover the oxide semiconductor layer 7.

As the gate insulating film, the silicon oxide layer is formed, for example. As the fourth conductive film, a metal such as molybdenum (Mo), tungsten (W), aluminum (Al), copper (Cu), titanium (Ti), or tantalum (Ta), or an alloy thereof can be used, for example. Here, a layered film having a Ti film as a lower layer and a Cu film as an upper layer is used.

Next, the fourth conductive film is patterned (for example, by wet etching) to form the second metal layer M2 including the gate bus line GL and the gate electrode GE. Thereafter, patterning (for example, by dry etching) of the gate insulating film is performed by using the same resist mask as that in the patterning of the fourth conductive film, and the gate insulating layer 9 is thereby formed. According to the method, when viewed from the normal direction of the substrate 1, the side surface of the second metal layer M2 and the side surface of the gate insulating layer 9 are aligned with each other.

Thereafter, the resistance lowering treatment (for example, plasma treatment) of the oxide semiconductor layer 7 may be performed. In this manner, the specific resistance of each of the first region 71 and the second region 72 that do not overlap with either the gate electrode GE or the gate insulating layer 9 of the oxide semiconductor layer 7 when viewed from the normal direction of the main surface of the substrate 1 can be made lower than the specific resistance of the channel region 7c that overlaps with the gate electrode GE and the gate insulating layer 9.

Subsequently, the inorganic insulating layer (having a thickness of, for example, 100 nm or greater and 1000 nm or less) 11 that covers the oxide semiconductor layer 7, the gate insulating layer 9, and the gate electrode GE is formed. The inorganic insulating layer 11 can be formed with a single layer or a multi-layer of an insulating film such as the silicon oxide film, the silicon nitride film, the silicon oxynitride film, the silicon nitride oxide film, or the like. The thickness of the inorganic insulating layer may be 100 nm or greater and 1000 nm or less. Here, as the inorganic insulating layer 11, for example, the SiNx layer (having a thickness of, for example, 300 nm) is formed by the CVD. When the hydrogen-donating film such as the SiNx film is used, the SiNx film is formed so as to be in contact with the exposed portion of the oxide semiconductor layer 7, so that the resistance lowering of the exposed portion of the oxide semiconductor layer 7 can be performed. Thus, the above-described resistance lowering treatment need not be performed.

Thereafter, the organic insulating layer 12 having the opening 12p is formed on the inorganic insulating layer 11. Subsequently, the common electrode CE and the dielectric layer 17 are formed on the organic insulating layer 12. The dielectric layer 17 and the inorganic insulating layer 11 are etched, and thus the pixel contact hole CHp for exposing a part of the second region 72 of the oxide semiconductor layer 7 is obtained in the dielectric layer 17, the organic insulating layer 12, and the inorganic insulating layer 11. Thereafter, the pixel electrode PE is formed on the dielectric layer 17 and in the pixel contact hole CHp. In this manner, the active matrix substrate 1002 is obtained.

Oxide Semiconductor

An oxide semiconductor included in the oxide semiconductor layer 7 may be an amorphous oxide semiconductor, or may be a crystalline oxide semiconductor including a crystalline portion. Examples of the crystalline oxide semiconductor include a polycrystalline oxide semiconductor, a microcrystalline oxide semiconductor, a crystalline oxide semiconductor having a c-axis oriented substantially perpendicular to the layer surface, and the like.

The oxide semiconductor layer 7 may have a layered structure including two or more layers. When the oxide semiconductor layer 7 has the layered structure, the oxide semiconductor layer 7 may include an amorphous oxide semiconductor layer and a crystalline oxide semiconductor layer. Alternatively, the oxide semiconductor layer may include a plurality of crystalline oxide semiconductor layers having different crystal structures. The oxide semiconductor layer may include a plurality of amorphous oxide semiconductor layers. When the oxide semiconductor layer 7 has a dual-layer structure that includes an upper layer and a lower layer, an energy gap of the oxide semiconductor included in a layer positioned on the gate electrode side of the two layers (that is, the lower layer in the case of the bottom gate structure, and the upper layer in the case of the top gate structure) may be smaller than an energy gap of the oxide semiconductor included in a layer positioned opposite from the gate electrode (that is, the upper layer in the case of the bottom gate structure, and the lower layer in the case of the top gate structure). Note that, in a case where a difference in the energy gap between these layers is relatively small, the energy gap of the oxide semiconductor included in the layer positioned on the gate electrode side may be greater than the energy gap of the oxide semiconductor included in the layer positioned opposite to the gate electrode.

Materials, structures, and film formation methods of an amorphous oxide semiconductor and the above-described crystalline oxide semiconductors, a configuration of an oxide semiconductor layer having a layered structure, and the like are described in, for example, JP 2014-007399 A. The entire contents of the disclosure of JP 2014-007399 A are incorporated herein by reference.

The oxide semiconductor layer 7 may include, for example, at least one metal element selected from In, Ga, and Zn. In the present embodiment, the oxide semiconductor layer 7 includes, for example, an In—Ga—Zn—O based semiconductor (for example, an indium gallium zinc oxide). Here, the In—Ga—Zn—O based semiconductor is a ternary oxide of indium (In), gallium (Ga), and zinc (Zn), and a ratio (composition ratio) of In, Ga, and Zn is not particularly limited. For example, the ratio includes In:Ga:Zn=2:2:1, In:Ga:Zn=1:1:1, In:Ga:Zn=1:1:2, or the like. Such an oxide semiconductor layer 7 can be formed of an oxide semiconductor film including an In—Ga—Zn—O based semiconductor.

The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein by reference. A TFT including an In—Ga—Zn—O based semiconductor layer has a high mobility (more than 20 times as compared to an a-Si TFT) and a low leakage current (less than 1/100 as compared to the a-Si TFT). Thus, such a TFT can be suitably used as a drive TFT (for example, a TFT included in a drive circuit provided in a periphery of a display region including a plurality of pixels, and on the same substrate as the display region) and a pixel TFT (TFT provided in a pixel).

In place of the In—Ga—Zn—O based semiconductor, the oxide semiconductor layer 7 may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of indium (In), tin (Sn), and zinc (Zn). Alternatively, the oxide semiconductor layer 7 may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, cadmium oxide (CdO), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, an In—W—Zn—O-based semiconductor, and the like.

INDUSTRIAL APPLICABILITY

Each of the embodiments of the disclosure can be applied suitably to an active matrix substrate. Such an active matrix substrate can be applied to various electronic devices such as a display device such as a liquid crystal display device, an organic electroluminescence (EL) display device, an inorganic electroluminescence display device, and the like, an imaging device such as an image sensor, an image input device, a fingerprint reader, a semiconductor memory, and the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:
1. An active matrix substrate comprising:
a substrate; and
a plurality of oxide semiconductor TFTs supported by the substrate, wherein
each of the plurality of oxide semiconductor TFTs includes
an oxide semiconductor layer including a channel region,
a lower electrode positioned between the oxide semiconductor layer and the substrate, and
an insulating layer positioned between the oxide semiconductor layer and the lower electrode,
the insulating layer has a layered structure including a lower layer, an upper layer positioned between the lower layer and the oxide semiconductor layer, and an intermediate layer positioned between the lower layer and the upper layer,
the upper layer is a silicon oxide layer,
the intermediate layer contains at least silicon and nitrogen,
the lower layer contains at least silicon, nitrogen, and oxygen, and
a hydrogen desorption amount of the lower layer is larger than a hydrogen desorption amount of the intermediate layer, and each of the hydrogen desorption amount of the lower layer and the hydrogen desorption amount of the intermediate layer is a desorption amount of hydrogen molecules per unit thickness, as measured in a temperature range from 25° C. to 600° C. by thermal desorption spectroscopy analysis.
2. The active matrix substrate according to claim 1, wherein the lower layer is thicker than the intermediate layer.
3. The active matrix substrate according to claim 1, wherein the intermediate layer is thicker than the lower layer.
4. The active matrix substrate according to claim 1, wherein the intermediate layer is a silicon nitride layer.
5. The active matrix substrate according to claim 1, wherein an oxygen concentration in the lower layer is lower than an oxygen concentration in the upper layer and higher than an oxygen concentration in the intermediate layer.

6. The active matrix substrate according to claim 5, wherein the lower layer is a silicon nitride oxide layer containing nitrogen at a higher ratio than oxygen.

7. The active matrix substrate according to claim 5, wherein the lower layer is a silicon oxynitride layer containing nitrogen at a lower ratio than oxygen.

8. The active matrix substrate according to claim 1, wherein the lower layer has a refractive index higher than a refractive index of the substrate and lower than a refractive index of the intermediate layer.

9. The active matrix substrate according to claim 1, wherein a thickness of the lower layer is three times or more of a thickness of the intermediate layer.

10. The active matrix substrate according to claim 1, wherein each of the plurality of oxide semiconductor TFTs is a bottom gate type TFT with the lower electrode as a gate electrode.

11. The active matrix substrate according to claim 1, wherein each of the plurality of oxide semiconductor TFTs further includes a gate electrode positioned on an opposite side to the substrate of the oxide semiconductor layer, and a gate insulating layer positioned between the oxide semiconductor layer and the gate electrode.

12. The active matrix substrate according to claim 1, wherein the oxide semiconductor layer of each of the plurality of oxide semiconductor TFTs includes an In—Ga—Zn—O-based semiconductor.

13. The active matrix substrate according to claim 12, wherein the oxide semiconductor layer includes a crystalline portion.

14. A manufacturing method of the active matrix substrate according to claim 1, the manufacturing method comprising:

forming the insulating layer, wherein the forming the insulating layer includes forming, using a CVD, the lower layer on the lower electrode at a first deposition rate, and forming, using a CVD, the intermediate layer on the lower layer at a second deposition rate lower than the first deposition rate.

* * * * *